US012718891B2

(12) United States Patent
Cao et al.

(10) Patent No.: US 12,718,891 B2
(45) Date of Patent: Aug. 25, 2026

(54) NON-VOLATILE MEMORY WITH NON-DISCHARGING READ

(71) Applicant: Sandisk Technologies, Inc., Milpitas, CA (US)

(72) Inventors: Wei Cao, Fremont, CA (US); Jiahui Yuan, Fremont, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 53 days.

(21) Appl. No.: 18/894,550

(22) Filed: Sep. 24, 2024

(65) Prior Publication Data

US 2026/0088101 A1 Mar. 26, 2026

(51) Int. Cl.

| | |
|---|---|
| ***G11C 16/26*** | (2006.01) |
| ***G11C 16/04*** | (2006.01) |
| ***G11C 16/08*** | (2006.01) |
| *H10B 43/10* | (2023.01) |
| *H10B 43/27* | (2023.01) |
| *H10B 43/35* | (2023.01) |
| *H10W 90/00* | (2026.01) |
| *H10W 90/20* | (2026.01) |
| *H10W 90/24* | (2026.01) |

(52) U.S. Cl.

CPC .......... *G11C 16/26* (2013.01); *G11C 16/0483* (2013.01); *G11C 16/08* (2013.01); *H10B 43/10* (2023.02); *H10B 43/27* (2023.02); *H10B 43/35* (2023.02); *H10W 90/00* (2026.01); *H10W 90/24* (2026.01); *H10W 90/297* (2026.01)

(58) Field of Classification Search

CPC ..... G11C 16/26; G11C 16/0483; G11C 16/08; H10B 43/10; H10B 43/27; H10B 43/35; H10W 90/00; H10W 90/24; H10W 90/297

USPC .................................................... 365/185.11

See application file for complete search history.

(56) References Cited

U.S. PATENT DOCUMENTS

| | | | | |
|---|---|---|---|---|
| 7,369,437 | B2 | 5/2008 | Kamei | |
| 7,440,331 | B2 | 10/2008 | Hemink | |
| 12,575,094 | B2 * | 3/2026 | Huang | H10B 20/387 |
| 2005/0213385 | A1 | 9/2005 | Hosono et al. | |
| 2018/0012667 | A1 * | 1/2018 | Costa | G11C 16/0483 |
| 2022/0229588 | A1 * | 7/2022 | Dutta | G06F 3/0659 |
| 2024/0126453 | A1 * | 4/2024 | Ahn | G11C 16/26 |

* cited by examiner

*Primary Examiner* — Amir Zarabian
*Assistant Examiner* — Minh Dinh
(74) *Attorney, Agent, or Firm* — PEARL COHEN LLP

(57) ABSTRACT

A non-volatile storage apparatus continuously maintains unselected word lines for multiple regions in multiple blocks at one or more overdrive voltages and continuously maintains unselected select lines for multiple regions in multiple blocks at one or more unselected voltages while performing a read process for non-volatile memory cells in one or more regions of one or more blocks of the same die, without lowering those signals to ground or another resting voltage. Selected word lines are separately temporarily toggled to a read reference voltage to enable reading and then reverted back to an overdrive voltage upon completion of the reading. Selected select lines are separately temporarily toggled to a select voltage to enable reading and then reverted back to an unselected voltage upon completion of the reading.

20 Claims, 22 Drawing Sheets

Storage System 100
Memory Controller 120
102
Host
152
Host Interface
156
Processor
158
ECC Engine
160
Memory Interface
130
Memory
NOC
154
DRAM Controller
164
volatile memory
140

Figure 4A
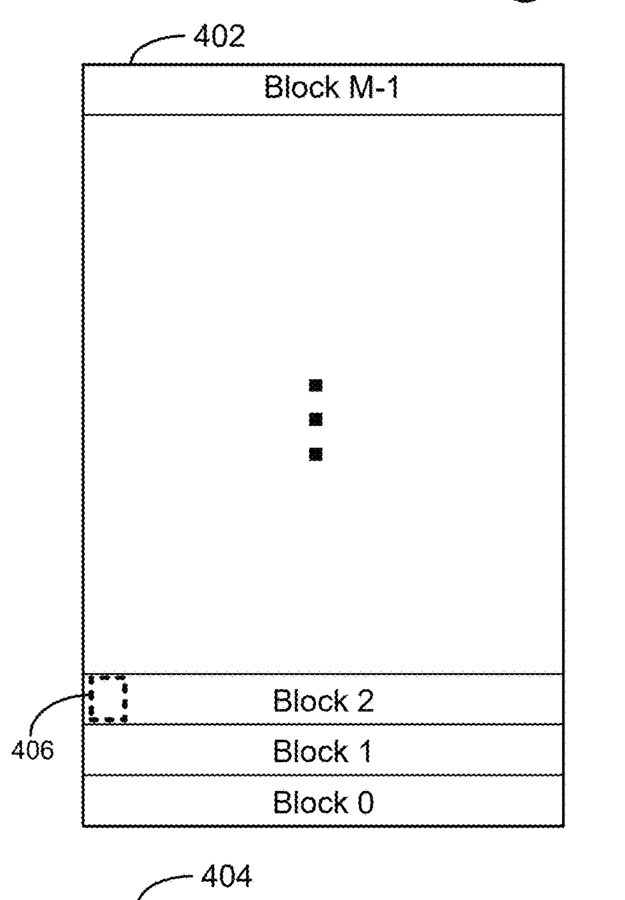
403
Block M-1
Block 2
Block 1
Block 0
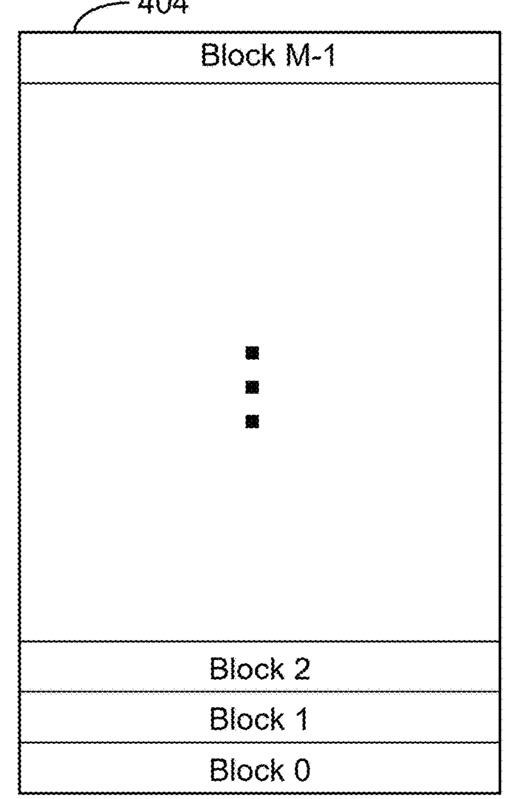
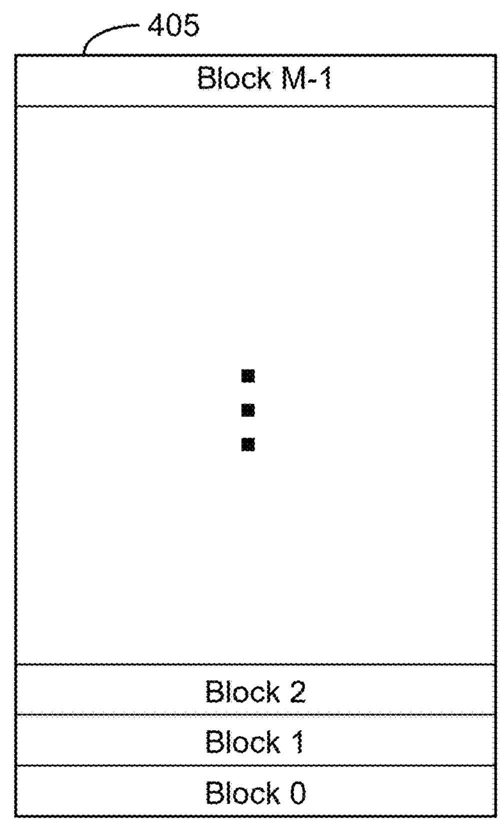

Bit Line
414
417
472
474

DL
SGDT0
SGDT1
SGD0
SGD1
DD0
DD1
WL161
WL160
WL159
Wl158
WL157
WL156
WL155
WL154
WL153
WL152
429
WL82
WL81
DU
Joint
DL
WL80
WL6
WL5
WL4
WL3
WL2
WL1
WL0
DS1
DS0
SGS1
SGS0
SGSB1
SGSB0
SL
454
453
z
x
y

472

429
DL
DL
MC1
WL160
WL160
DL
DL
MC2
WL159
WL159
DL
DL
MC3
WL158
WL158
DL
DL
MC4
WL157
WL157
DL
DL
MC5
498
497
WL156
WL156
496
497
498
493
492
491
490
491
492
493 of memory cells
Vt
Er
A
B
C
D
E
F
G
Vev
VvA
VrA
VvB
VrB
VvC
VrC
VvD
VrD
VvE
VrE
VvF
VrF
VvG
VrG
Vfd number of cells
S0
S1
S2
S3
S4
S5
S6
S7
S8
S9
S10
S11
S12
S13
S14
S15
$V_T$ Figure 7
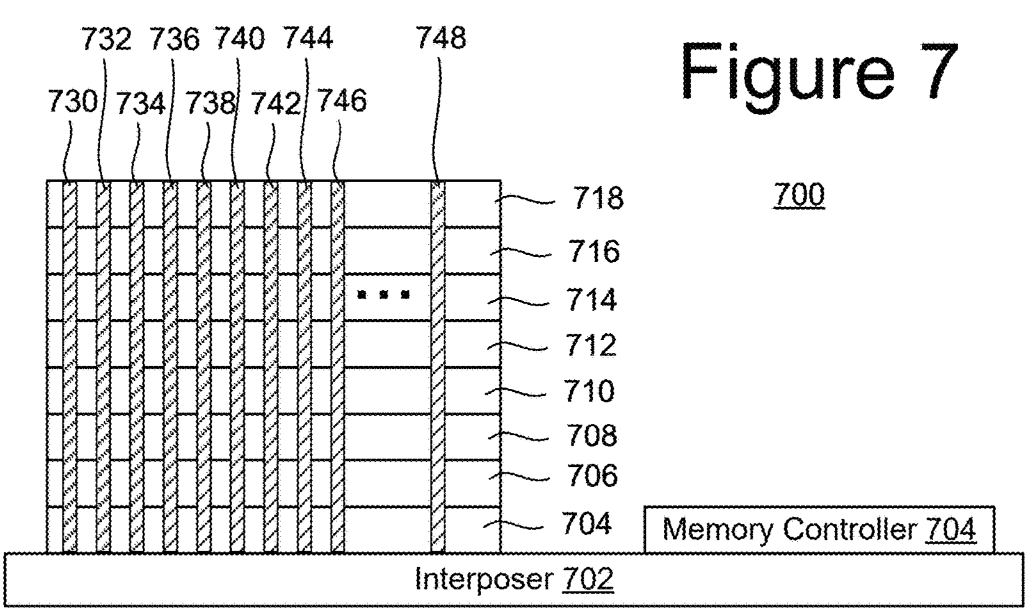
Figure 8B
Figure 8A
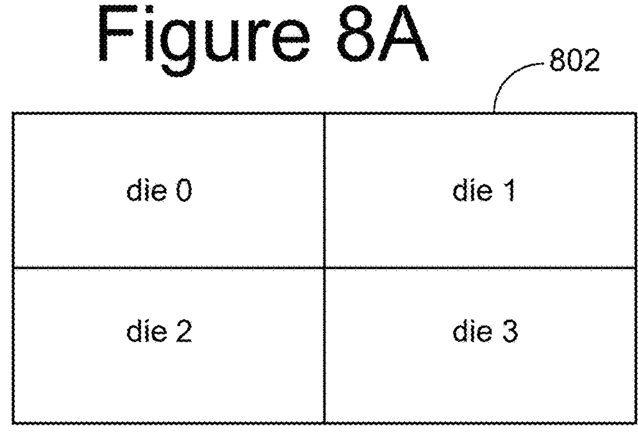
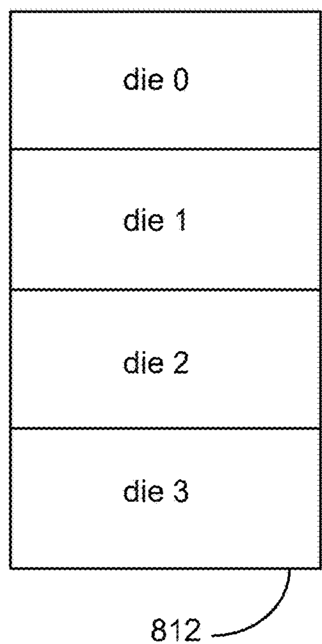

960 8 bit I/O circuit, communicating at 5GB/s 902 4KB 904 4KB 906 4KB 908 4KB 962 8 bit I/O circuit, communicating at 5GB/s 910 4KB 912 4KB 914 4KB 916 4KB 964 8 bit I/O circuit, communicating at 5GB/s 918 4KB 920 4KB 922 4KB 924 4KB 966 8 bit I/O circuit, communicating at 5GB/s 926 4KB 928 4KB 930 4KB 932 4KB

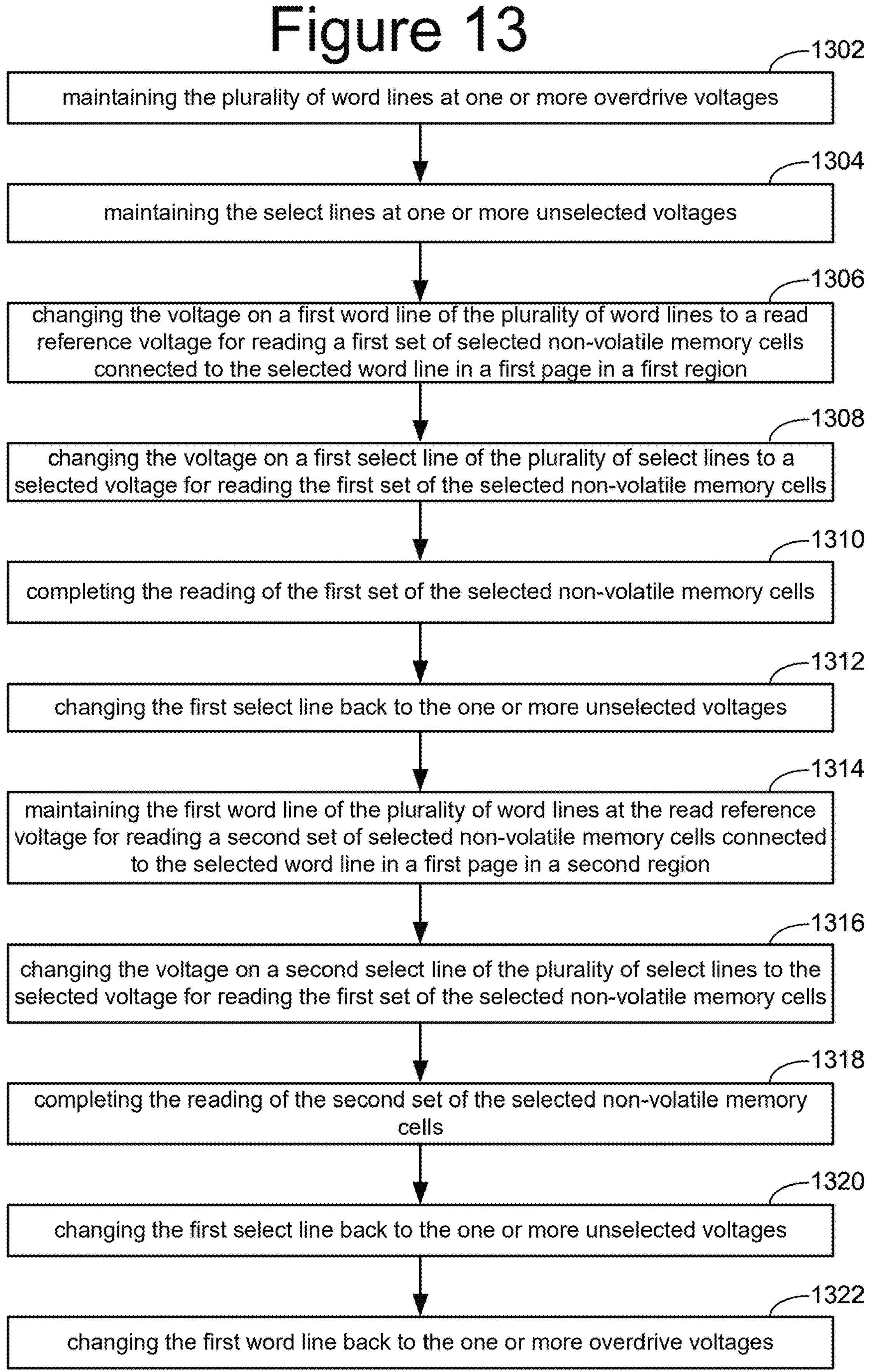
Figure 13
1302
maintaining the plurality of word lines at one or more overdrive voltages
1304
maintaining the select lines at one or more unselected voltages
1306
changing the voltage on a first word line of the plurality of word lines to a read reference voltage for reading a first set of selected non-volatile memory cells connected to the selected word line in a first page in a first region
1308
changing the voltage on a first select line of the plurality of select lines to a selected voltage for reading the first set of the selected non-volatile memory cells
1310
completing the reading of the first set of the selected non-volatile memory cells
1312
changing the first select line back to the one or more unselected voltages
1314
maintaining the first word line of the plurality of word lines at the read reference voltage for reading a second set of selected non-volatile memory cells connected to the selected word line in a first page in a second region
1316
changing the voltage on a second select line of the plurality of select lines to the selected voltage for reading the first set of the selected non-volatile memory cells
1318
completing the reading of the second set of the selected non-volatile memory cells
1320
changing the first select line back to the one or more unselected voltages
1322
changing the first word line back to the one or more overdrive voltages

| | 430 | 440 | 450 | 460 | 470 |
|---|---|---|---|---|---|
| | | | ⋮ | | |
| WL2 | 1422 | 1424 | 1426 | 1428 | 1430 |
| WL1 | 1412 | 1414 | 1416 | 1418 | 1420 |
| WL0 | 1402 | 1404 | 1406 | 1408 | 1410 |

NON-VOLATILE MEMORY WITH NON-DISCHARGING READ

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. However, users of memory typically do not like to wait long for the memory to read data stored on the memory. Thus, there is a desire for read operations to be efficient and high performance. Additionally, there is also benefits from using less power when performing memory operations, as power usage can increase costs, increase operating temperatures and reduce time of operation.

BRIEF DESCRIPTION OF THE DRAWINGS

Like-numbered elements refer to common components in the different figures.

FIG. 4A is a block diagram of one embodiment of a memory structure having two planes.

FIG. 7 depicts a non-volatile memory system capable of performing a high bandwidth read process.

FIG. 8A is a block diagram of one layer of a stack of memory die.

FIG. 8B is a block diagram of one layer of a stack of memory die.

FIG. 9 is a block diagram depicting a partial floor plan for a memory die.

FIG. 13 is a flow chart describing one embodiment of a method performed during a read process.

DETAILED DESCRIPTION

A non-volatile storage apparatus continuously maintains unselected word lines for multiple regions in multiple blocks at one or more overdrive voltages and continuously maintains unselected select lines for multiple regions in multiple blocks at one or more unselected voltages while performing a read process for non-volatile memory cells in one or more regions of one or more blocks of the same die (or multiple/different die), without lowering those signals to ground or another resting voltage. Selected word lines are separately temporarily toggled to a read reference voltage to enable reading and then reverted back to an overdrive voltage upon completion of the reading. Selected select lines are separately temporarily toggled to a select voltage to enable reading and then reverted back to an unselected voltage upon completion of the reading. This operational technique for reading increases performance since time is not wasted lowering voltages back to resting voltages between read operations and then adjusting the voltages for the next read operation. Because there is less ramping up voltages for the next read operation, less power is used.

Figure 1:
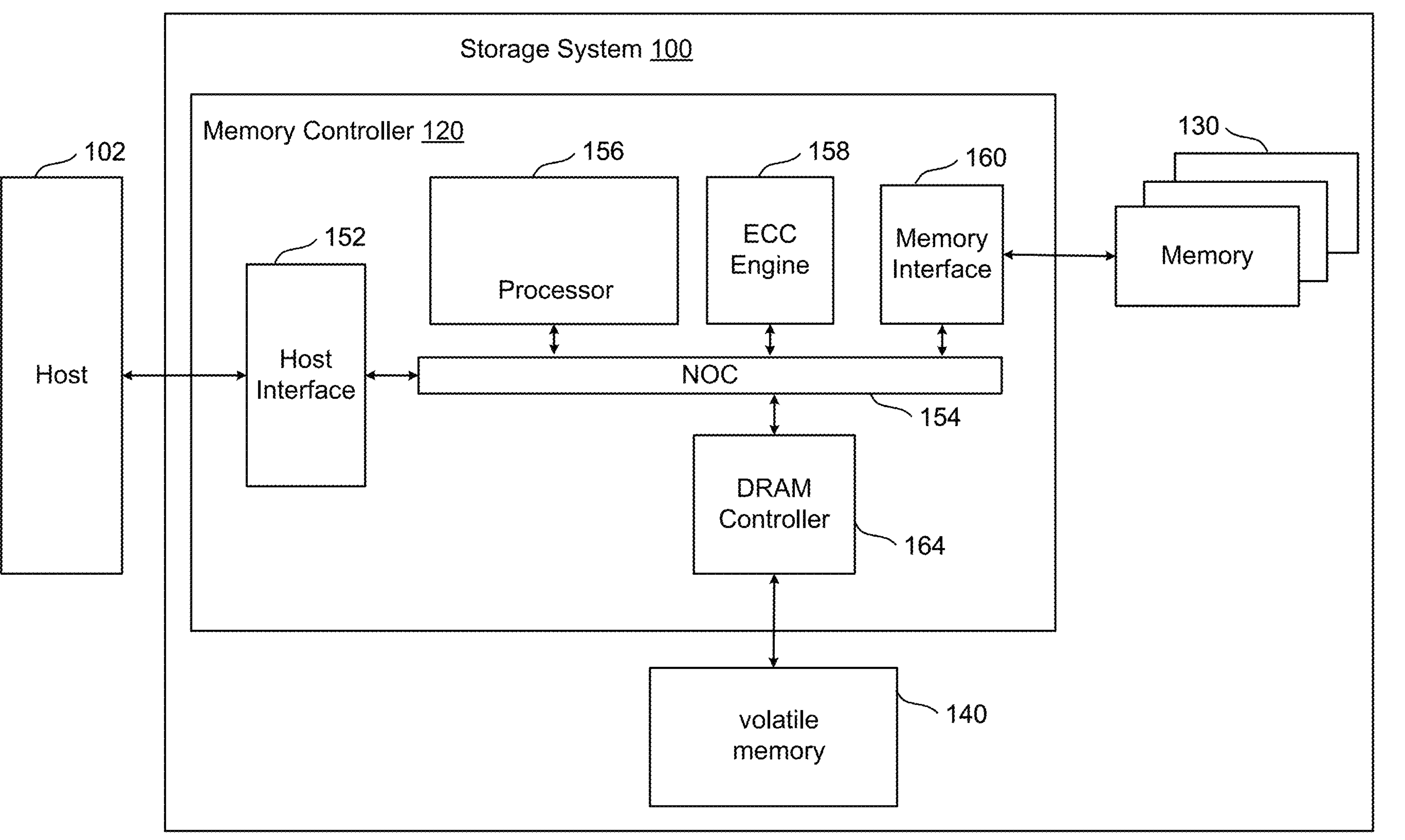
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die

130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
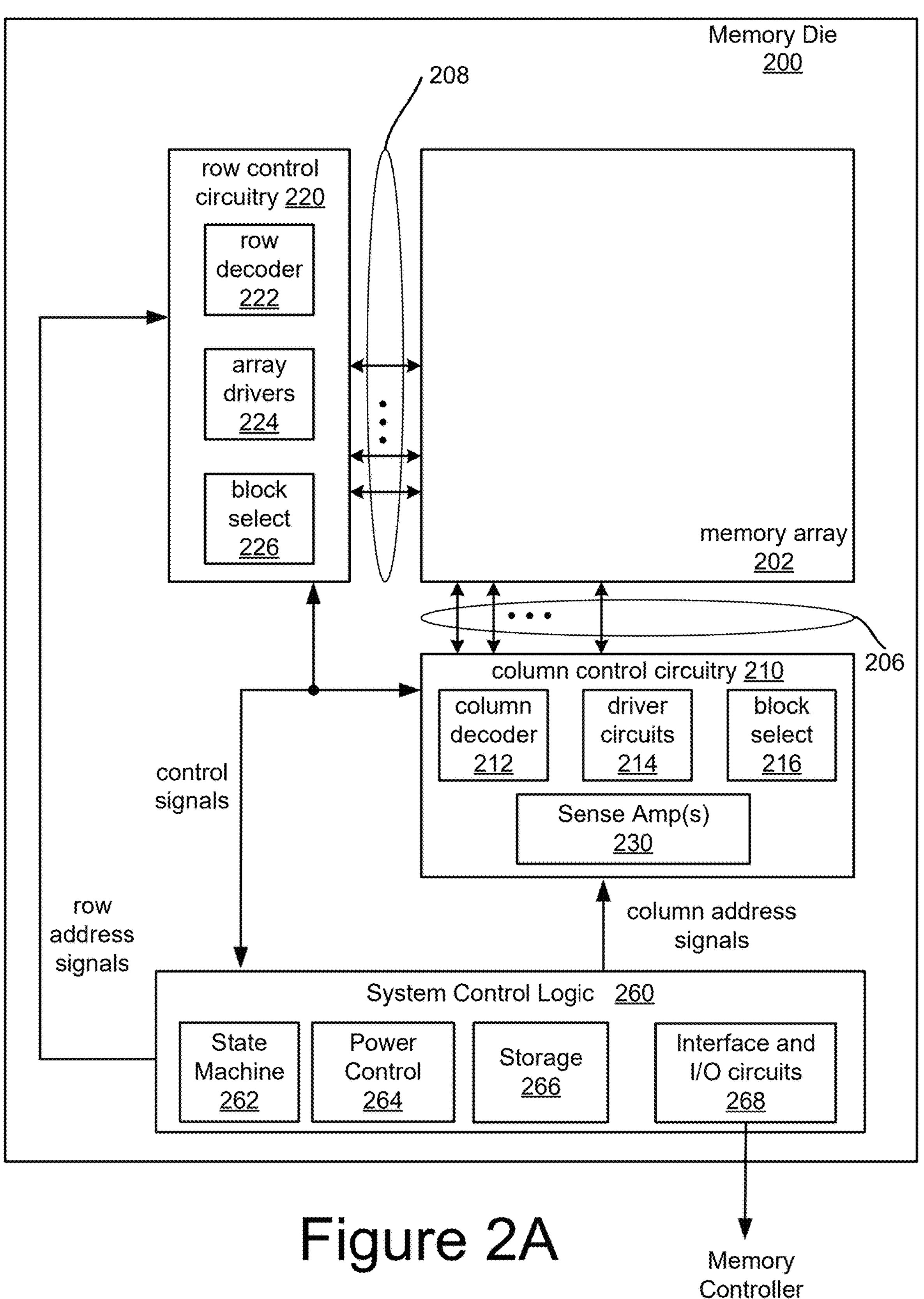
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120 and includes one or more Input/Output ("I/O") circuits.

Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory array die) and some or all of the peripheral circuitry elements, including one or more control circuits, can be formed on a separate die (referred to as the control die). For example, a memory array die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory array die to be optimized individually according to its technology. For example, a NAND memory array die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory array die and one control die, other embodiments can use more die, such as two memory array die and one control die, for example.

Figure 2B:
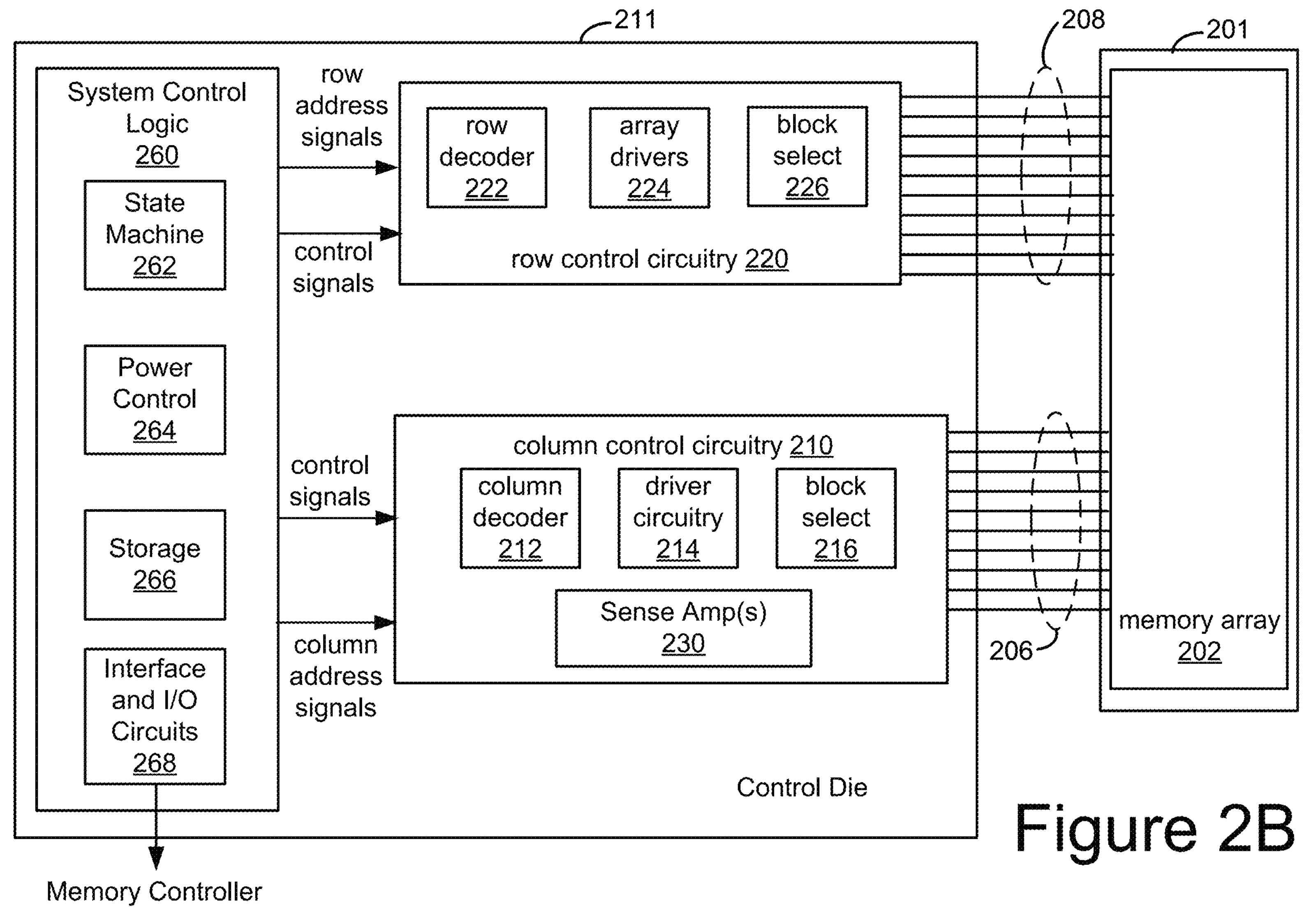
FIG. 2B is a block diagram of one embodiment of an integrated memory assembly (also referred to as a memory die).

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207, which is another example of a memory die. One or more integrated memory assemblies (one or more memory die) 207 may be used to implement the non-volatile memory 130 of storage system 100. The integrated memory assembly (or memory die) 207 includes two types of semiconductor die (or more succinctly, "die"). Memory array die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory array die 201. In some embodiments, the memory array die 201 and the control die 211 are bonded together.

FIG. 2B shows an example of the peripheral circuitry, including control circuits, formed in a peripheral circuit or control die 211 coupled to memory structure 202 formed in memory array die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory array die 201. In some embodiments, some of the circuitry in the system control logic 260 is located on the memory array die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory array die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory array die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory array die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
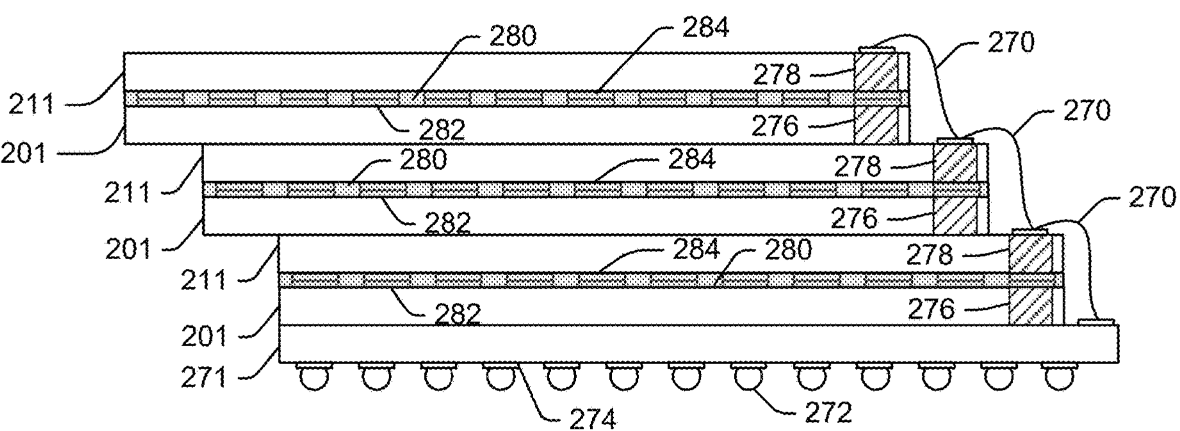
FIGS. 3A and 3B depict different embodiments of integrated memory assemblies.

Some embodiments include a stack of multiple memory die (e.g., multiple control die 211 and multiple memory array die 201). FIG. 3A depicts a side view of an embodiment of a stack of multiple memory die on a substrate 271 (e.g., a stack comprising control dies 211 and memory array dies 201). The depicted stack has three control dies 211 and three memory array dies 201. In some embodiments, there are more than three memory array dies 201 and more than three control die 211.

Each control die 211 is affixed (e.g., bonded) to at least one of the memory array dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The memory dies 207 may, for example, be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory array die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly (memory die) 207 electrically and mechanically to a host device such as a printed circuit board. Solder balls 272 may be omitted where the integrated memory assembly (memory die) 207 is to be used as an LGA package. The solder balls 272 may form a part of the interface between integrated memory assembly (memory die) 207 and memory controller 120.

Figure 3B:
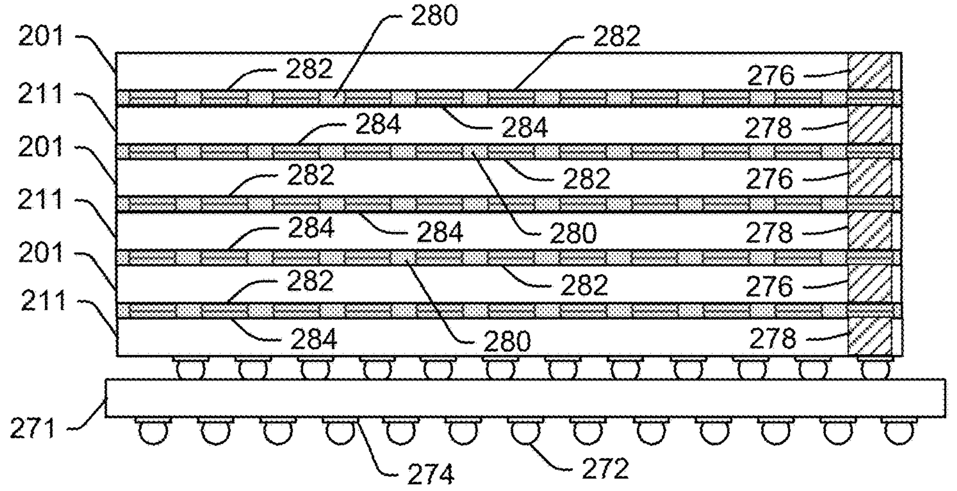

FIG. 3B depicts a side view of another embodiment of memory dies stacked on a substrate 271. The depicted stack includes three control die 211 and three memory array die 201. In some embodiments, there are many more than three memory array dies 201 and many more than three control dies 211. In this example, each control die 211 is bonded to at least one memory array die 201. Optionally, a control die 211 may be bonded to two or more memory array die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the stack of FIG. 3B does not have a stepped offset. A memory array die through silicon via (TSV) 276 may be used to route signals through a memory array die 201. A control die through silicon via (TSV) 278 may be used to route signals through a control die 211.

As has been briefly discussed above, the control die 211 and the memory array die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

In a stack of control dies 211 and memory array dies 201 (e.g., as depicted in FIG. 3A or 3B), the TSV's from the various die of the stack can be shorted together to form a single bus or they can run in parallel to each other so each die can be separately operated and communicated with.

Figure 4:
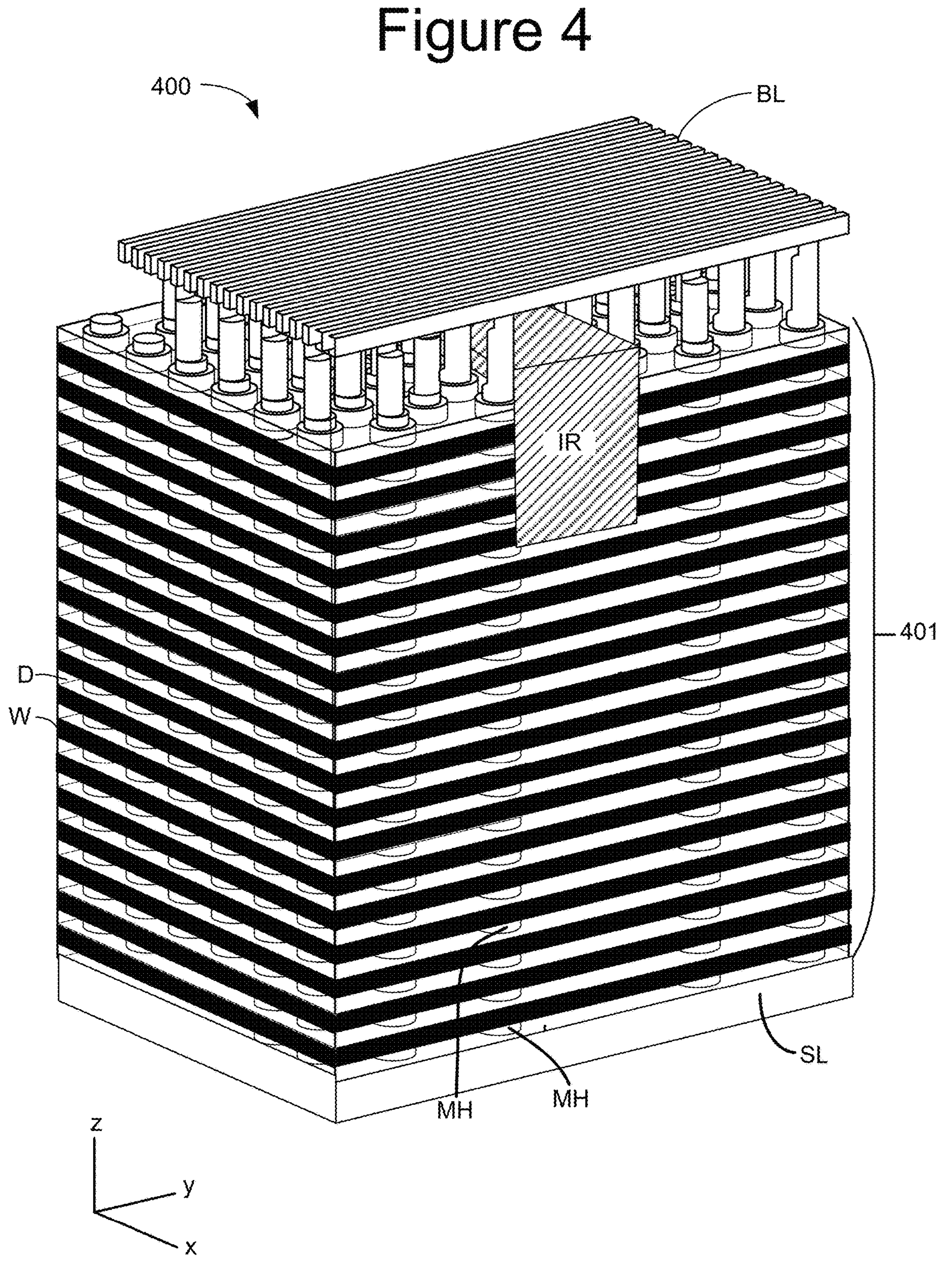
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

FIG. 4A is a block diagram explaining one example organization of memory structure 202, which is divided into four planes 402, 403, 404 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows four planes, more or less than four planes can be implemented. In some embodiments, memory structure 202 includes eight planes.

Figure 4B:
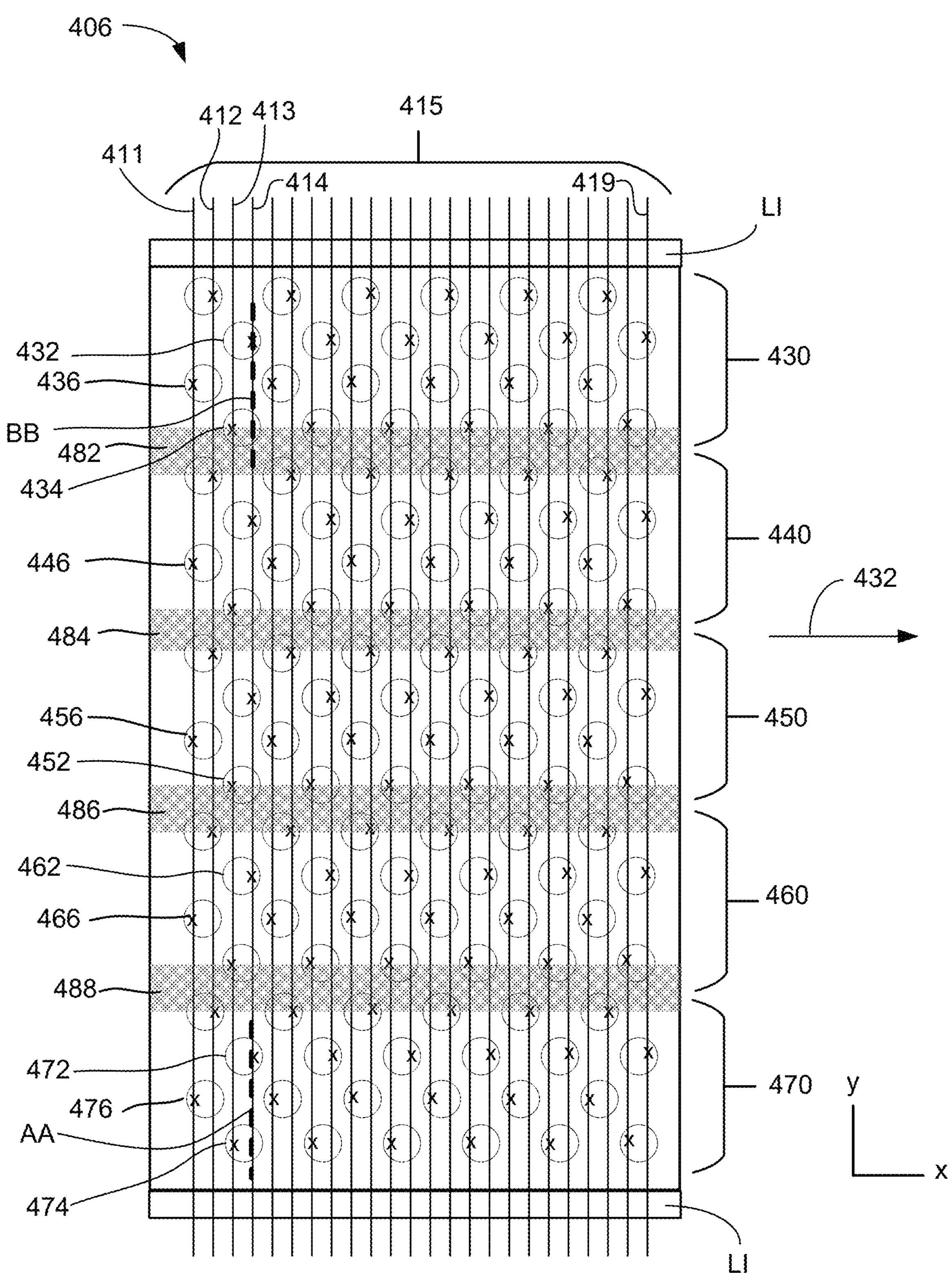
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
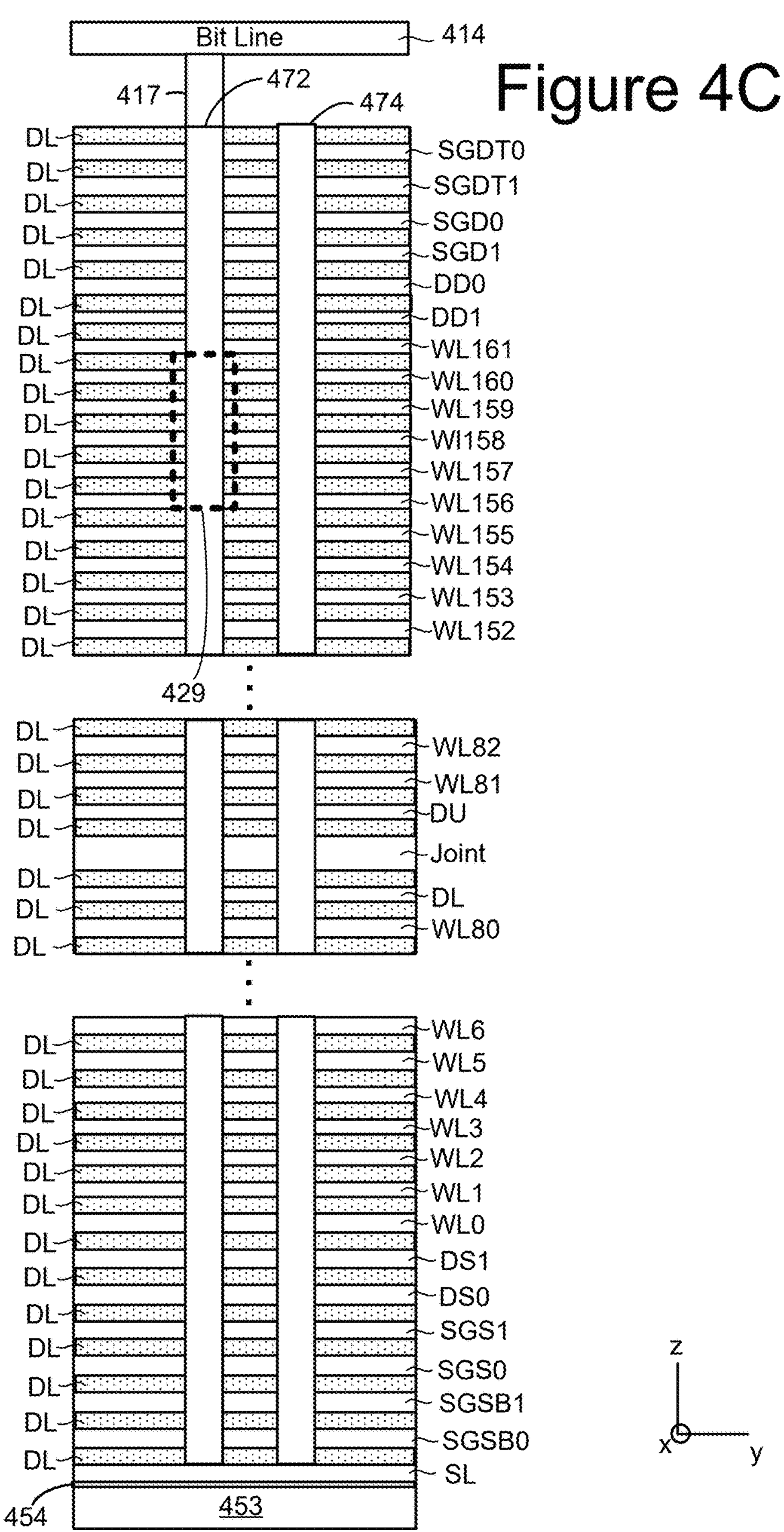
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) are connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To case this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
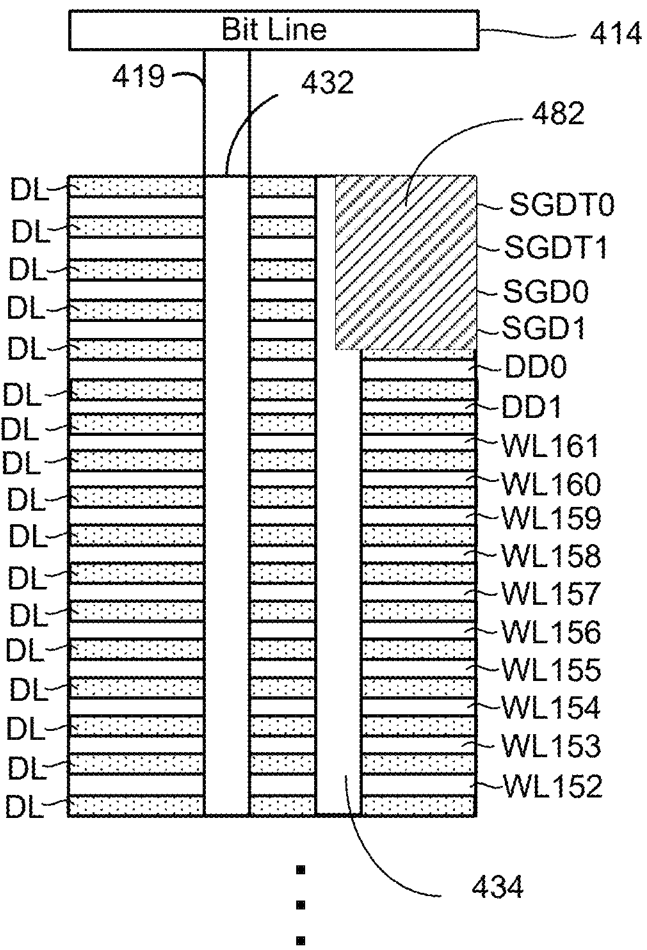
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND stings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
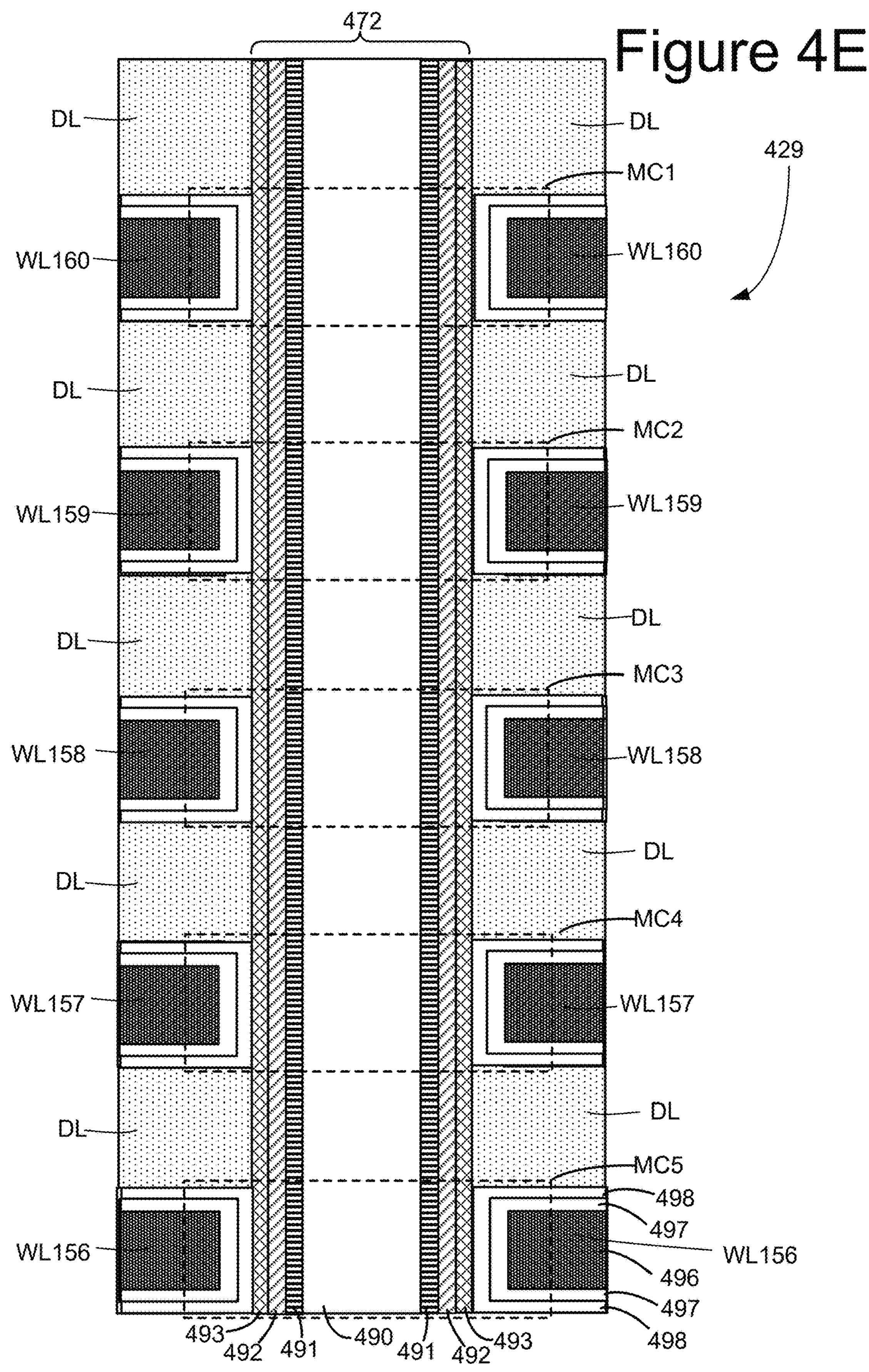
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
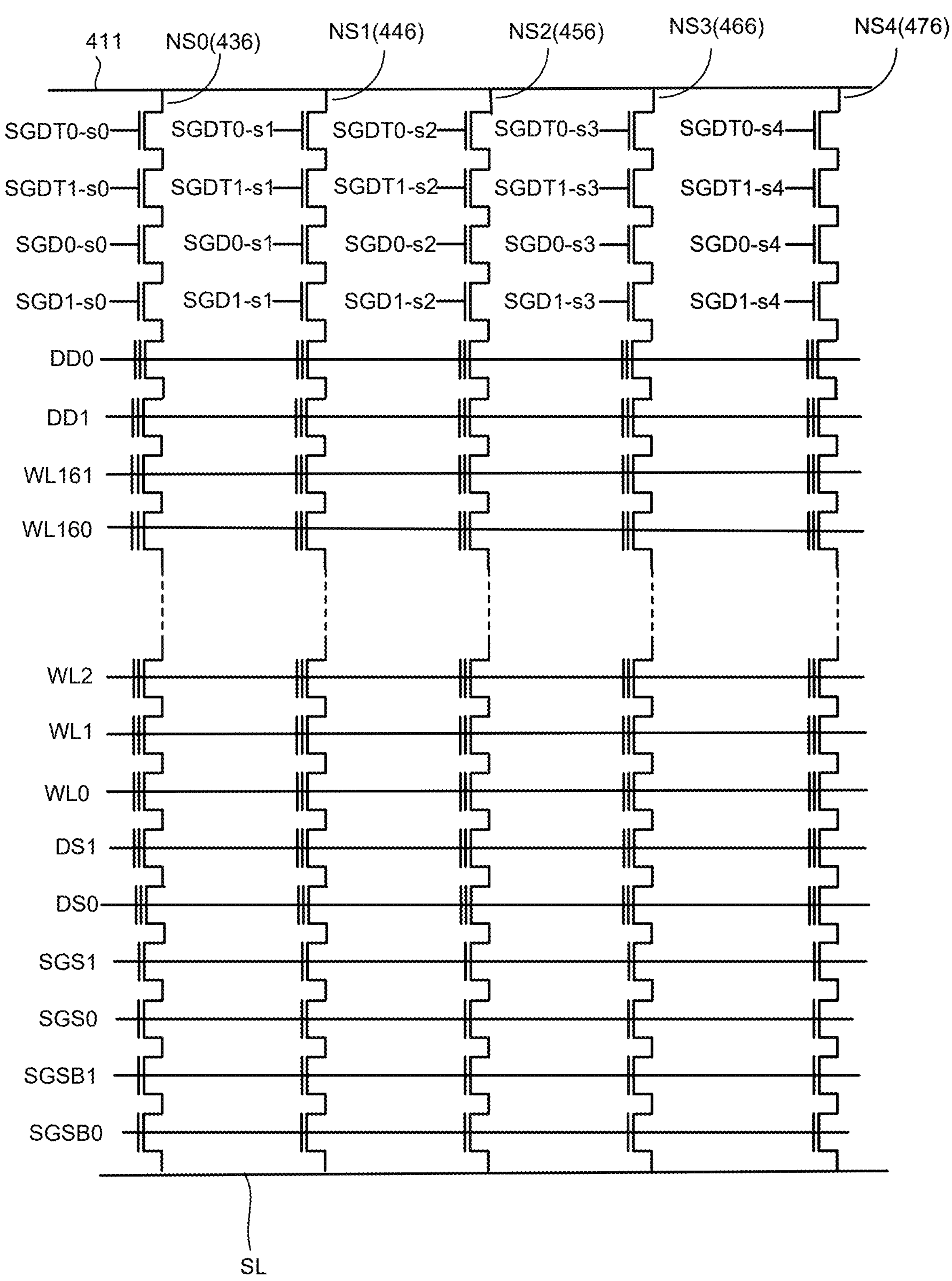
FIG. 4F is a schematic of a plurality of NAND strings in multiple regions of a same block.

FIG. 4F is a schematic diagram of a portion of the three dimensional memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/ vertical column 466 of region 460), and NAND string NS4 (which corresponds to memory hole/vertical column 476 of region 470).

Drain side select line/layer SGD0 is separated by isolation regions 482, 484, 486 and 488 to form SGD0-*s*0, SGD0-*s*1, SGD0-*s*2, SGD0-*s*3 and SGD0-*s*4 in order to separately connect to and independently control regions 430, 440, 450, 460, 470. Similarly, drain side select line/layer SGD1 is separated by isolation regions 482, 484, 486 and 488 to form SGD1-*s*0, SGD1-*s*1, SGD1-*s*2, SGD1-*s*3 and SGD1-*s*4 in order to separately connect to and independently control regions 430, 440, 450, 460, 470; drain side GIDL generation transistor control line/layer SGDT0 is separated by isolation regions 482, 484, 486 and 488 to form SGDT0-*s*0, SGDT0-*s*1, SGDT0-*s*2, SGDT0-*s*3 and SGDT0-*s*4 in order to separately connect to and independently control regions 430, 440, 450, 460, 470; drain side GIDL generation transistor control line/layer SGDT1 is separated by isolation regions 482, 484, 486 and 488 to form SGDT1-*s*0, SGDT1-*s*1, SGDT1-*s*2, SGDT1-*s*3 and SGDT1-*s*4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
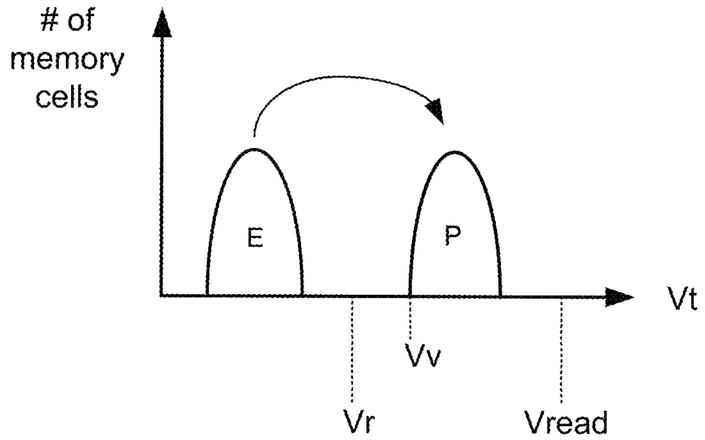
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). To test whether the threshold voltage of a given memory cell is above or below Vr, the system applies Vr to the selected word line (the word line connected to the memory cells selected for reading) and applied Vread to unselected word lines (word lines not connected to any memory cells selected for reading). Vread is an example of an overdrive voltage because it is high enough to turn on the memory cell regardless of which data state the memory cell has been programmed to; for example, FIG. 5A depicts Vread being higher in voltage magnitude than any of the threshold voltages associated with the threshold voltage distribution for data state P. In some memory systems, Vread is set between 6-8 volts (e.g., one or more overdrive voltages). FIG. 5A also depicts verify reference voltage Vv. In some embodiments, when programming memory cells to data state P, the system will test whether those memory cells have a threshold voltage greater than or equal to Vv. To test whether the threshold voltage of a given memory cell is above or below Vv, the system applies Vv to the selected word line (the word line connected to the memory cells selected for programming) and applies Vread to unselected word lines (word lines not connected to any memory cells selected for programming).

Figure 5B:
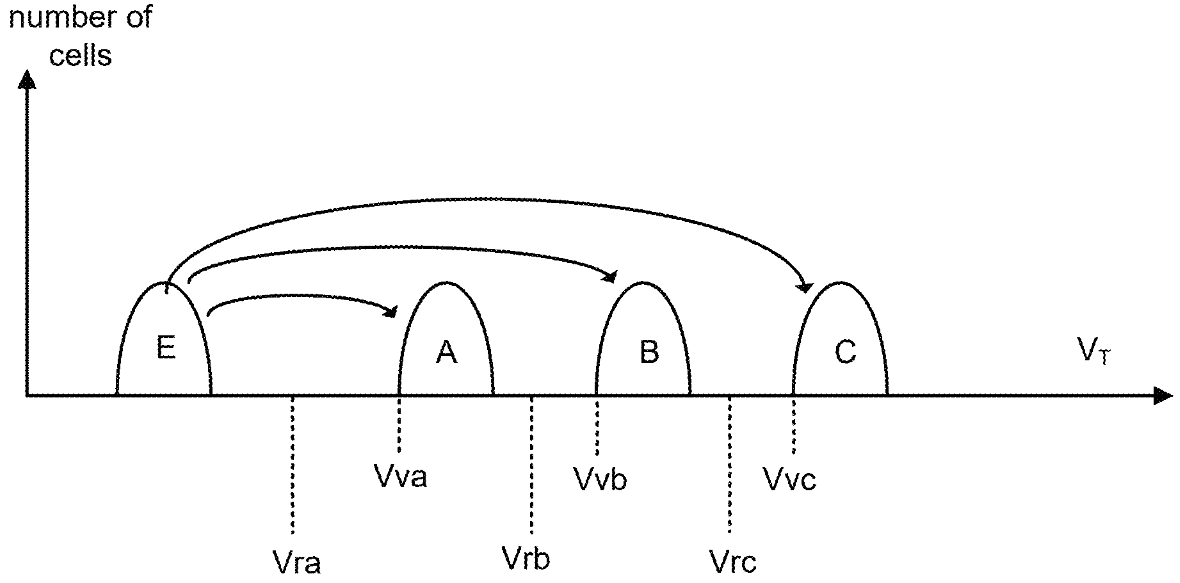
FIG. 5B depicts threshold voltage distributions.
Figures 5C, 5D:
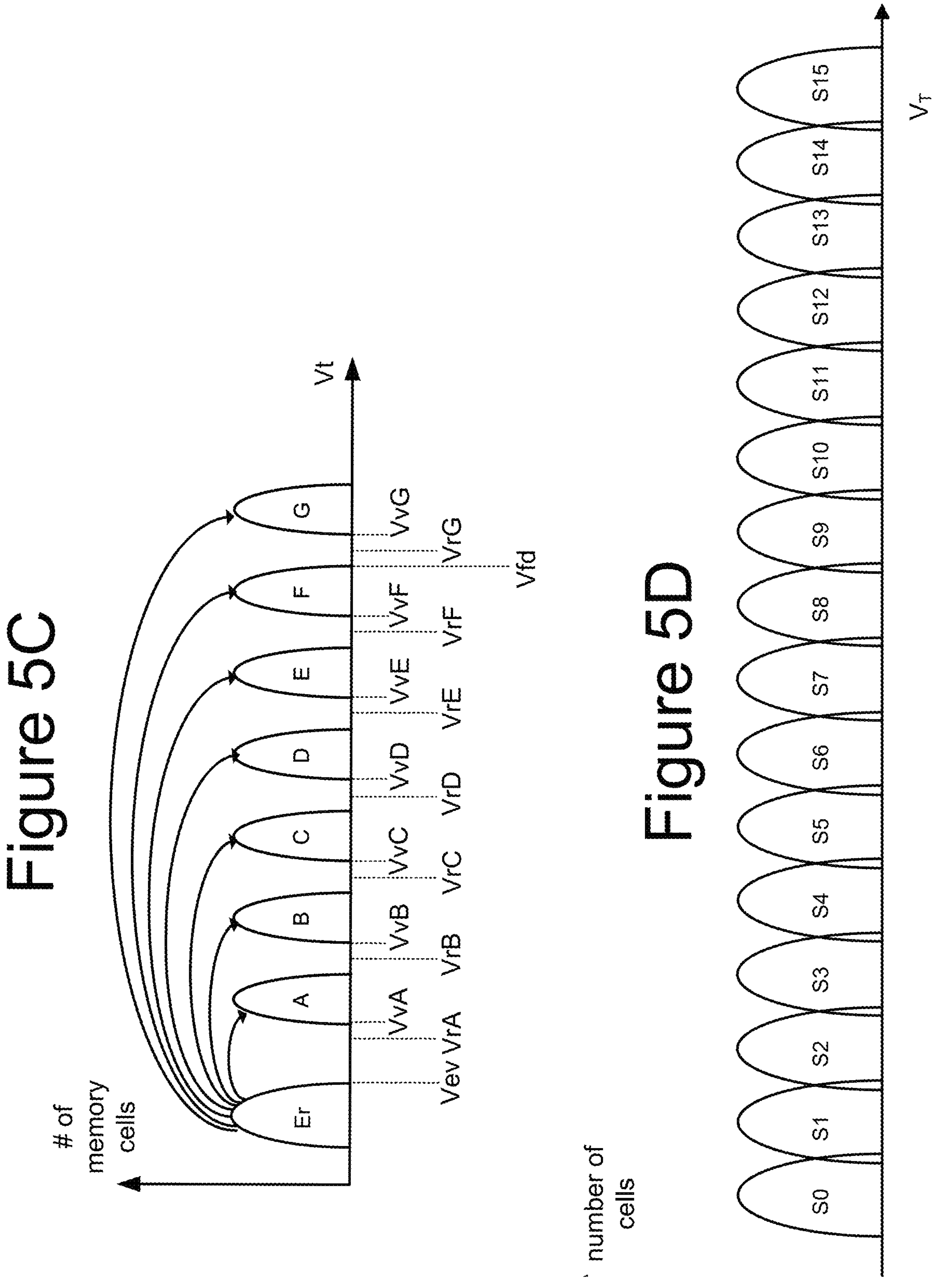
FIG. 5C depicts threshold voltage distributions.
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 6:
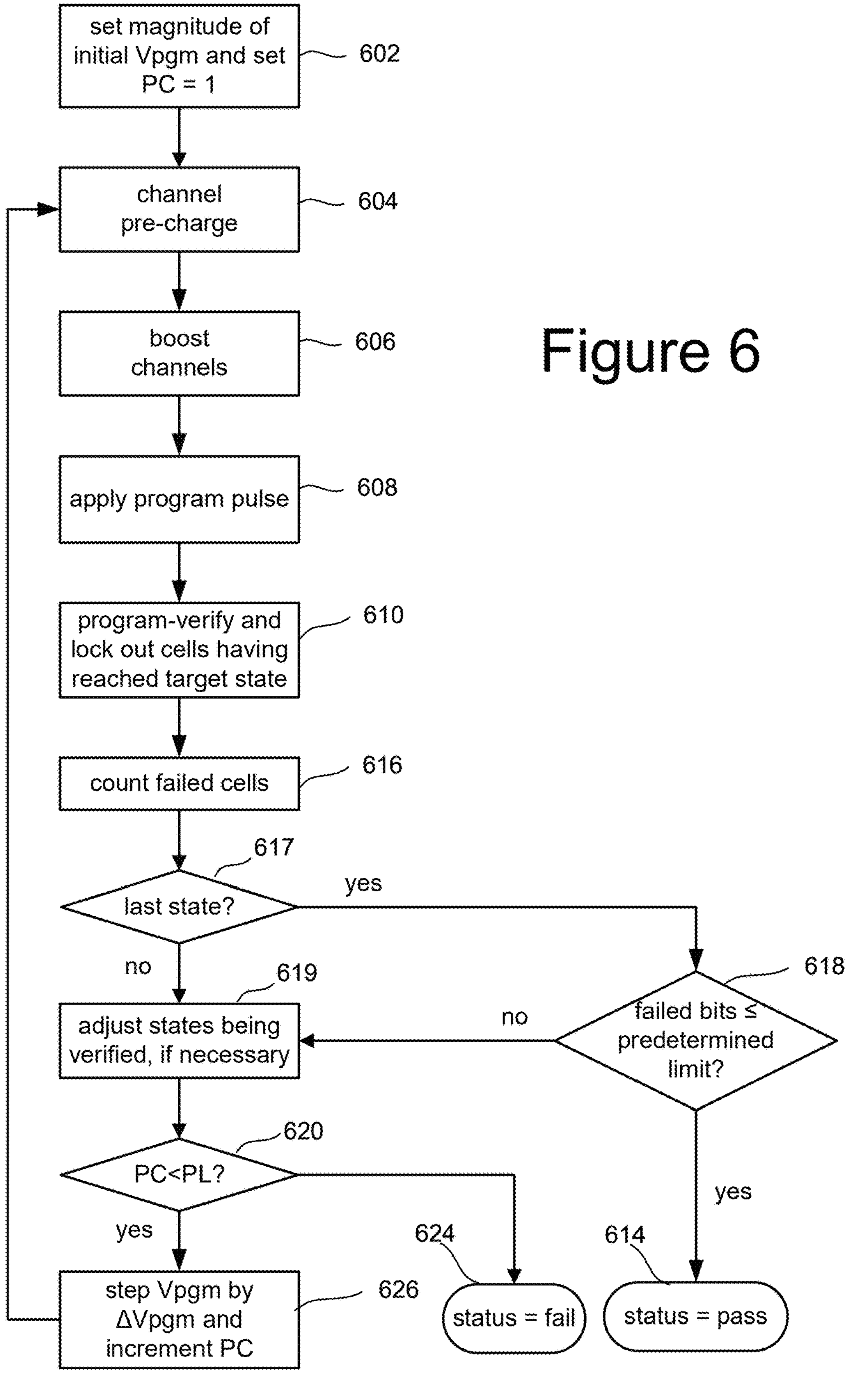
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by the memory die using the one or more control circuits (e.g., system control logic 260, column control circuitry 210, row control circuitry 220) of control die 211 to program memory cells on memory array die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C); depending on the result of the verify operation, the second program loop may perform verify for data states A and B; depending on the result of the verify operation the third program loop may perform verify for data states B and C; and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

The non-volatile memory structure described above can be used to implement a memory system that is capable of performing a high bandwidth read process. FIG. 7 depicts one embodiment of a non-volatile memory system 700 capable of performing a high bandwidth read process. Non-volatile memory system 700 includes a stack of memory dies. The stack of memory dies comprises multiple layers; for example, FIG. 7 depicts eight layers: 704, 706, 708, 710,712, 714, 716 and 718. In other embodiments, more or less than eight layers can be included. Each layer comprises multiple memory die. Below the eight layers 704-718 is interposer 702. Next to the stack, and depicted on top of interposer 702, is Memory Controller 704. In other embodiments, Memory Controller 704 can be underneath interposer 702, off interposer 702 or in a different location. In one embodiment, Memory Controller 704 implements the structure of Memory Controller 120 of FIG. 1, while in other embodiments different architectures can be used for the memory controller.

The stack of memory dies comprising the eight layers 704-718 includes a plurality of TSVs. FIG. 7 depicts TSVs 730, 732, 734, 736, 738, 740, 742, 744, 746, . . . 748. In one embodiment, each memory die includes its own separate set of TSVs that are used to communicate with Memory Controller 704 (via interposer 702) and each memory die's separate set of TSVs run parallel to other memory die's separate set of TSVs to form parallel paths (separate parallel TSV's) to/from Memory Controller 704.

An interposer, which is known in the art, is a component used in electronics and semiconductor manufacturing to facilitate connections between different components or technologies that might not naturally interface with each other due to differences in form factor, electrical specifications, or other factors. An interposer is an electrical interface routing between connection to another. In some cases, the purpose of an interposer is to spread a connection to a wider pitch or to reroute a connection to a different connection. In the structure of FIG. 7, interposer connects to all of the TSVs of each of the memory die of the eight layers 704-718 and connects to Memory Controller 704 for purposes of routing the electrical signals between the TSVs of each of the memory dies of the eight layers 704-718 and Memory Controller 704. In this manner, Memory Controller 704 can perform a high bandwidth read process for data stored in the stack across all or multiple of the memory dies of layers 704-718.

FIG. 8A is a block diagram of one layer 802 of layers 704-718. Layer 802 can be used to implement any layer of or all layers of layers 704-718. Layer 802 includes four memory dies: die 0, die 1, die 2 and die 3. Each of those memory dies (die 0, die 1, die 2 and die 3) can be based on the structure of FIG. 2A, the structure of FIG. 2B or a different structure for a non-volatile memory die. As will be discussed in more detail below, each memory die comprises multiple planes (arrays), groups of planes form banks, each memory die has multiple I/O circuits such that there is one I/O circuit per bank, and the separate parallel TSV's (e.g., 730-748) comprise separate parallel TSV's for each I/O circuit of each memory die.

FIG. 8B is a block diagram of another embodiment of one layer of layers 704-718. Layer 812 of FIG. 8B can be used to implement any layer of or all layers of layers 704-718. Layer 812 includes four memory dies: die 0, die 1, die 2 and die 3. Each of those memory dies (die 0, die 1, die 2 and die 3) can be based on the structure of FIG. 2A, the structure of FIG. 2B or a different structure for a non-volatile memory die.

Figure 9:
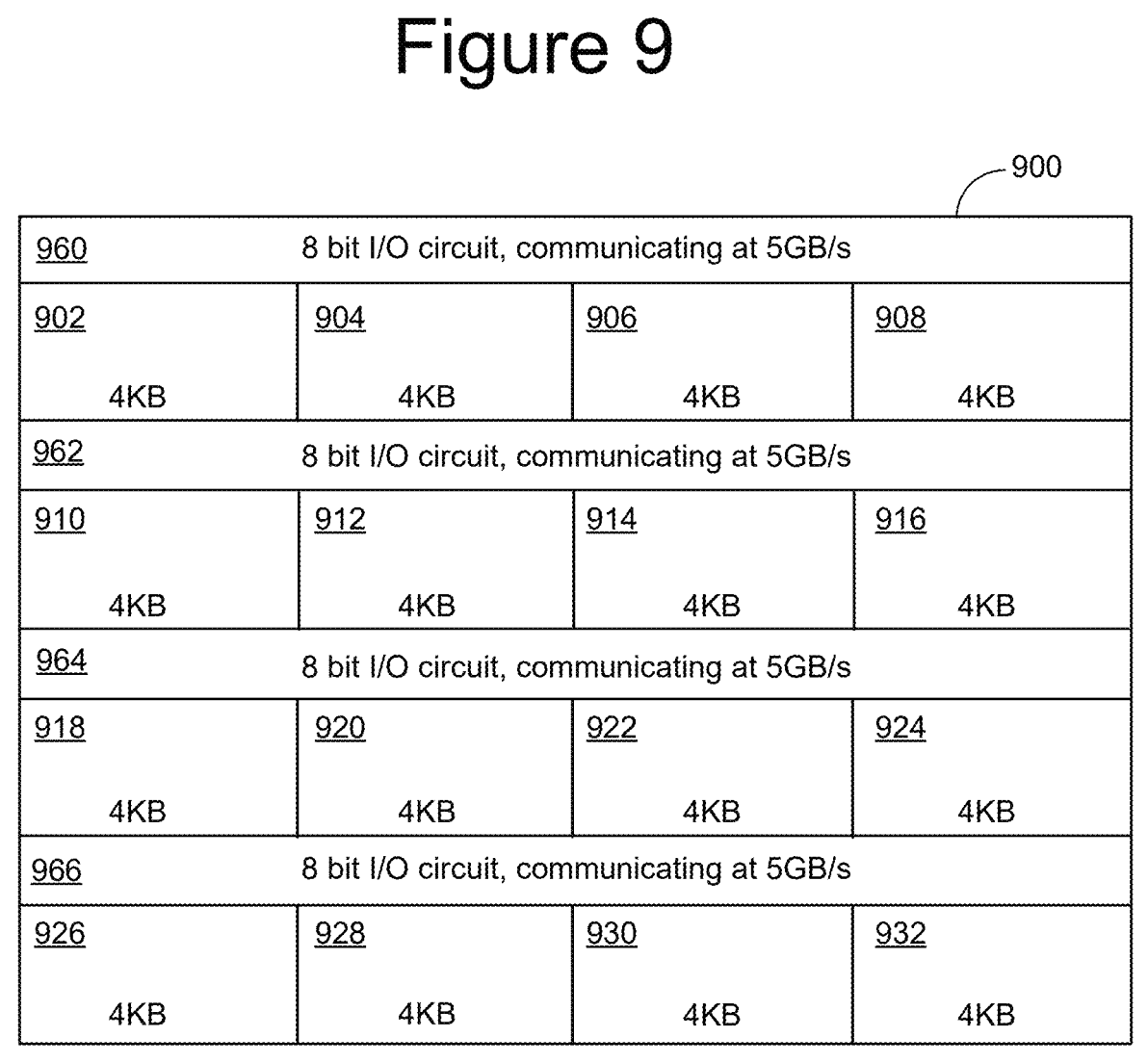

FIG. 9 is a block diagram depicting one embodiment of a partial floorplan for a memory die 900 (i.e. looking down at the memory die). In one embodiment, memory die 900 can implement the structure of FIG. 2A, the structure of FIG. 2B or a different structure for a non-volatile memory die. Memory die 900 is an example of a memory die that can be used on each of layers 704-718 depicted in FIG. 7. That is, memory die 900 can be used to implement memory die 0, memory die 1, memory die 2 and memory die 3 of FIGS. 8A and 8B for any or all of layers 704-718. Memory die 900 includes sixteen planes: 902, 904, 906, 908,910, 912, 914, 916, 918, 920, 922, 924, 926, 928, 930 and 932. Each plane is divided into pages of 4K Bytes. The planes are grouped into banks and memory die 900 includes one I/O circuit per bank. In one embodiment, there are four banks for memory die 900. The first bank comprises planes 902, 904, 906 and 908, and is connected to (and uses) I/O circuit 960. That means that data to programmed into or read from planes 902, 904, 906 and 908 is communicated between memory die 900 and memory controller 704 via I/O circuit 960. The second bank comprises planes 910, 912, 914, and 916, and is connected to (and uses) I/O circuit 962. That means that data to programmed into or read from planes 910, 912, 914, and 916 is communicated between memory die 900 and memory controller 704 via I/O circuit 962. The third bank comprises planes 918, 920, 922, and 924, and is connected to (and uses) I/O circuit 964. That means that data to programmed into or read from planes 918, 920, 922, and 924 is communicated between memory die 900 and memory controller 704 via I/O circuit 964. The fourth bank comprises planes 926, 928, 930 and 932, and is connected to (and uses) I/O circuit 966. That means that data to programmed into or read from planes 926, 928, 930 and 932 is communicated between memory die 900 and memory controller 704 via I/O circuit 966.

I/O circuits 960, 962, 964 and 966 each implement a separate eight bit data bus and are able to communicate at 5 Giga Bytes ("GB") per second. The eight bit data bus is implemented as eight TSVs (see e.g., TSVs 730-748). Since there are four I/O circuits in memory die 900, then memory die 900 needs thirty two TSVs. In one embodiment, I/O circuits 960, 962, 964 and 966 are part of Interface and I/O circuits 268 of FIG. 2A or 2B. In one embodiment, I/O circuits 960, 962, 964 and 966 further comprise input and output drivers (large out drivers with many stages to enable the I/O driving few pF load) and clocking to track the data.

In one embodiment, memory die 900 can sense data in 3.2 us and 64 KB can be sensed at the same time (4 KB page×16 planes). Therefore, memory die 900 can sense 21 GB per second. Since the four I/O circuits of memory die 900 each transmit eight bits at 5 GB per second, the memory die can transfer 20 GB of sensed data per second, which is slightly slower than the sensing speed of 21 GB per second. Since there are four memory die on a layer (e.g., layer 802 of FIG. 8), each layer can transmit 80 GB per second. Since there are eight layers (see layers 704-718 of FIG. 7), the memory system of FIG. 7 can transmit 640 GB per second when implementing memory die 900.

Looking back at FIG. 7, to implement four memory dies 900 on a level requires 32 TSVs for each of the four memory dies, for a total of 128 TSVs for each level. Since there are memory dies on eight layers (e.g., layers 704-718) then 1024 TSVs are needed (32 TSVs per memory die×32 memory die). These 1024 TSVs are not connected to each other (e.g., no memory die's I/O is connected to another memory die's I/O), rather they are in parallel to each other and all connect to Memory Controller 704 via interposer 702. In this manner, a read process can be performed that delivers 640 GB of data per second to Memory Controller 704.

Figure 10:
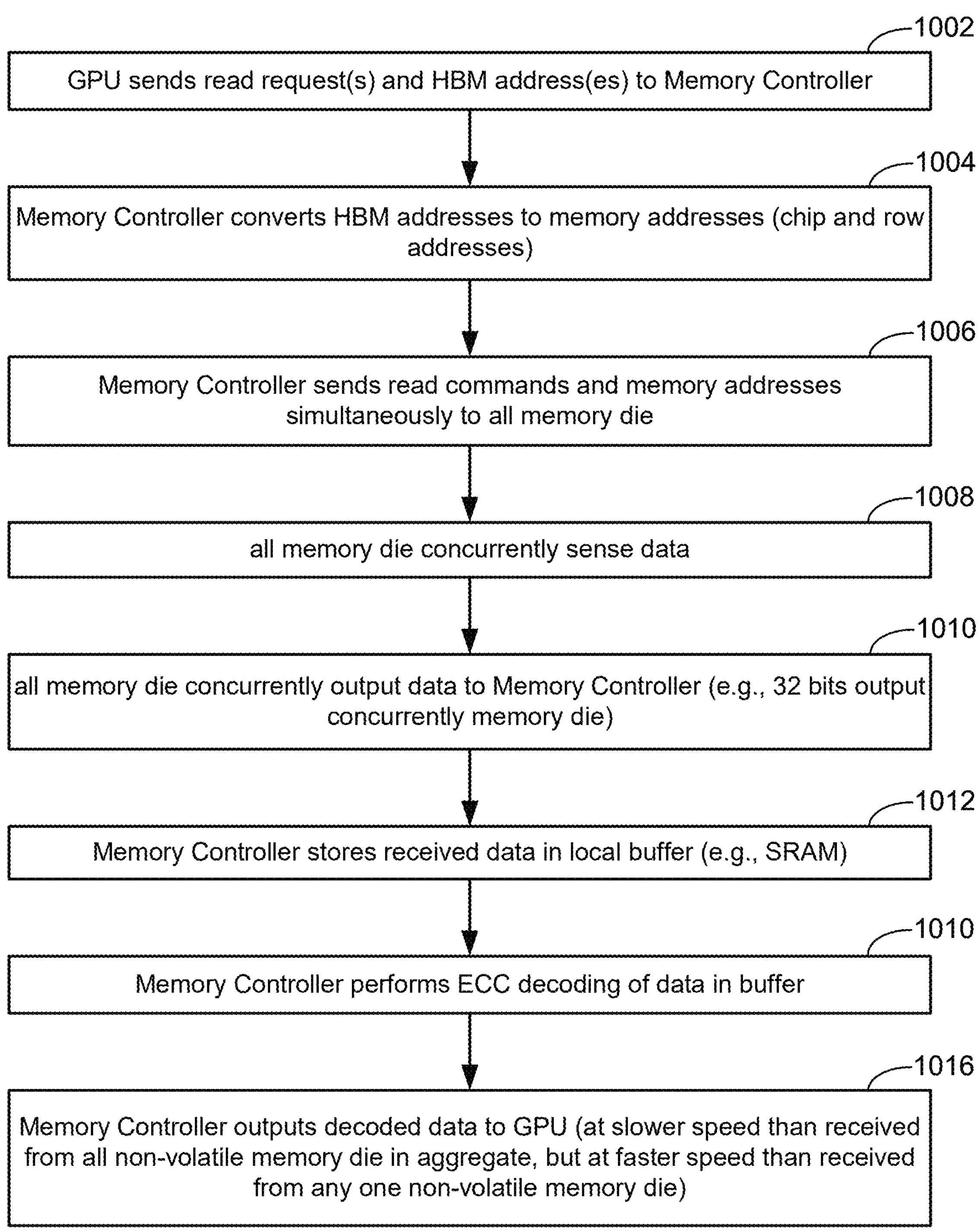
FIG. 10 is a flow chart describing one embodiment of a process for performing a high bandwidth read process.

FIG. 10 is a flow chart describing one embodiment of a process for performing a high bandwidth read process. The process of FIG. 10 can be performed with the structure of FIGS. 7-9. In one embodiment, each of the TSVs discussed above can be used for transmitting commands, addresses and data. In other embodiments, each of the TSVs discussed above are used for transmitting data only and additional TSV's are used to transmit addresses and commands. In some embodiments, addresses and commands are transmitted on different signals and in other embodiments addresses and command are combined.

The process of FIG. 10 can be performed by any one of the one or more control circuits discussed above. In one embodiment, the process of FIG. 10 is performed by memory controller 120 in combination with System Control Logic 260, Column Control Circuitry 210 and Row Control Circuitry 220. Alternatively, the process of FIG. 10 can be performed entirely by a control circuit on memory die 200 (see FIG. 2A) or entirely by a control circuit on integrated memory assembly 207 (see FIG. 2B), rather than by memory controller 120. In one example, the process of FIG. 10 is performed by or at the direction of state machine 262, using other components of System Control Logic 260, Column Control Circuitry 210 and Row Control Circuitry 220.

One example use case is to deploy the non-volatile memory to store a trained model for an inference engine as part of an artificial intelligence application. Typically, the trained model is programmed into the non-volatile memory once and then read many times. To support the input needs of the inference engine, the process of reading the model must be performed at a high bandwidth. Typically, DRAM is used as a High Bandwidth Memory ("HBM") to store a trained model. However, non-volatile memory can be less expensive then DRAM. Therefore, the process of FIG. 10 uses the non-volatile memory of FIG. 7 as the HBM to store a trained model (or other data). In this example use case, host 102 is a Graphics Processing Unit ("GPU") operating as an inference engine in an artificial intelligence system. The GPU needs to read portions of the trained model from the HBM (in this case the non-volatile memory of FIG. 7).

In step 1002, the GPU sends read request(s) and HBM address(es) to Memory Controller 704 in order to obtain portions of a trained model (the data to be read). In step 1004, Memory Controller 704 converts the HBM addresses to non-volatile memory addresses (chip addresses and row addresses). The chip addresses indicate which memory die is being read. The row address indicates the page on the addressed memory die. In step 1006, Memory Controller 704 sends read commands and page addresses (includes block address) simultaneously to all memory die in the stack depicted in FIG. 7. For example, read commands and page addresses are concurrently sent to all thirty two memory die of the eight layers depicted in FIG. 7. Other embodiments may include more or less than thirty two memory die. In step 1008, all memory die that received read commands and addresses concurrently sense data. In step 1010, all of the memory die that sensed data concurrently output data to Memory Controller 704 (e.g., 32 bits output concurrently per non-volatile memory die using the TSV's discussed above). In step 1012, Memory Controller 704 stores the received data in a local buffer (e.g., SRAM). There can be one buffer for data received from all memory die, or a separate buffer in the Memory Controller 704 for each memory die. In step 1014, Memory Controller 704 performs ECC decoding of data stored in the local buffer. In another embodiment, the decoded data is moved to an output buffer rather than remaining in the local buffer where the received data was initially stored. In step 1016, Memory Controller 704 outputs the decoded data to the GPU (e.g., in one embodiment, at slower speed than received from all non-volatile memory die in aggregate, but at faster speed than received from any one non-volatile memory die). In one example, the data is received at the Memory Controller 704 at 640 GB per second or 1280 GB per second, and the data is output to the GPU at 620 GB per second or 640 GB per second. These numbers are examples and other speeds can also be implemented; for example, data can be transmitted from the memory dies to the Memory Controller 704 at faster speeds than 1280 GB per second (e.g., 2048 GB/s if the speed on each line is increased or more lines/TSVs are used). In one example, the data is received at the Memory Controller 704 as 1024 bits in parallel or 2048 bits in parallel, and the data is output to the GPU as 64 bits in parallel.

In some embodiments, in order to perform high bandwidth read processes, the memory system will perform a large sequential read. In one example, a sequential read is a memory access pattern whereby large contiguous blocks of data are read from adjacent locations (in one or more memory die) enabling the data to be pipelined out of the memory at a very fast rate. In past read processes, the control circuit will apply various voltages to the word lines and select lines to perform the read operation. For example, select lines (e.g., SGD0-*s*0, SGD0-*s*1, SGD0-*s*2, SGD0-*s*3, SGD0-*s*4, SGD1-*s*0, SGD1-*s*1, SGD1-*s*2, SGD1-*s*3 and SGD1-*s*4—see FIG. 4F) connected to regions selected to be read (e.g., 430-470 for each of the blocks, for each of the planes for each of the dies) are raised to a selected voltage (e.g., 3.5-5 volts) from an unselected voltage (e.g., 0 volts), unselected word lines are raised to Vread (an overdrive voltage) and selected word lines (connected to memory cells selected to be read) are raised to an appropriate read compare voltage (e.g., Vr of FIG. 5A or Vra-VrG of FIG. 5C). Between each read operation, the word lines and select lines are lowered down to a resting voltage (e.g., Vss or 0 volts). Then, to perform the next read operation in the sequential read process, the select lines connected to regions selected to be read are again raised to the selected voltage from an unselected voltage, unselected word line are raised to Vread and selected word lines are raised to an appropriate read compare voltage. Ramping down the voltage to the resting voltage and subsequently ramping up back to the necessary voltages for the reading between read operations takes time, thereby, increasing the amount of time needed to perform a read process. Additionally, repeatedly ramping up to the necessary voltages for the reading at the beginning of each read operation of a sequential read process uses extra power as every time the voltages are ramped up more power is needed.

To reduce the time needed to perform a sequential read and/or to reduce the power used to perform a sequential read it is proposed to perform a sequential read process without discharging the word lines and/or adjusting select lines between read operations of the sequential read process.

Figure 11:
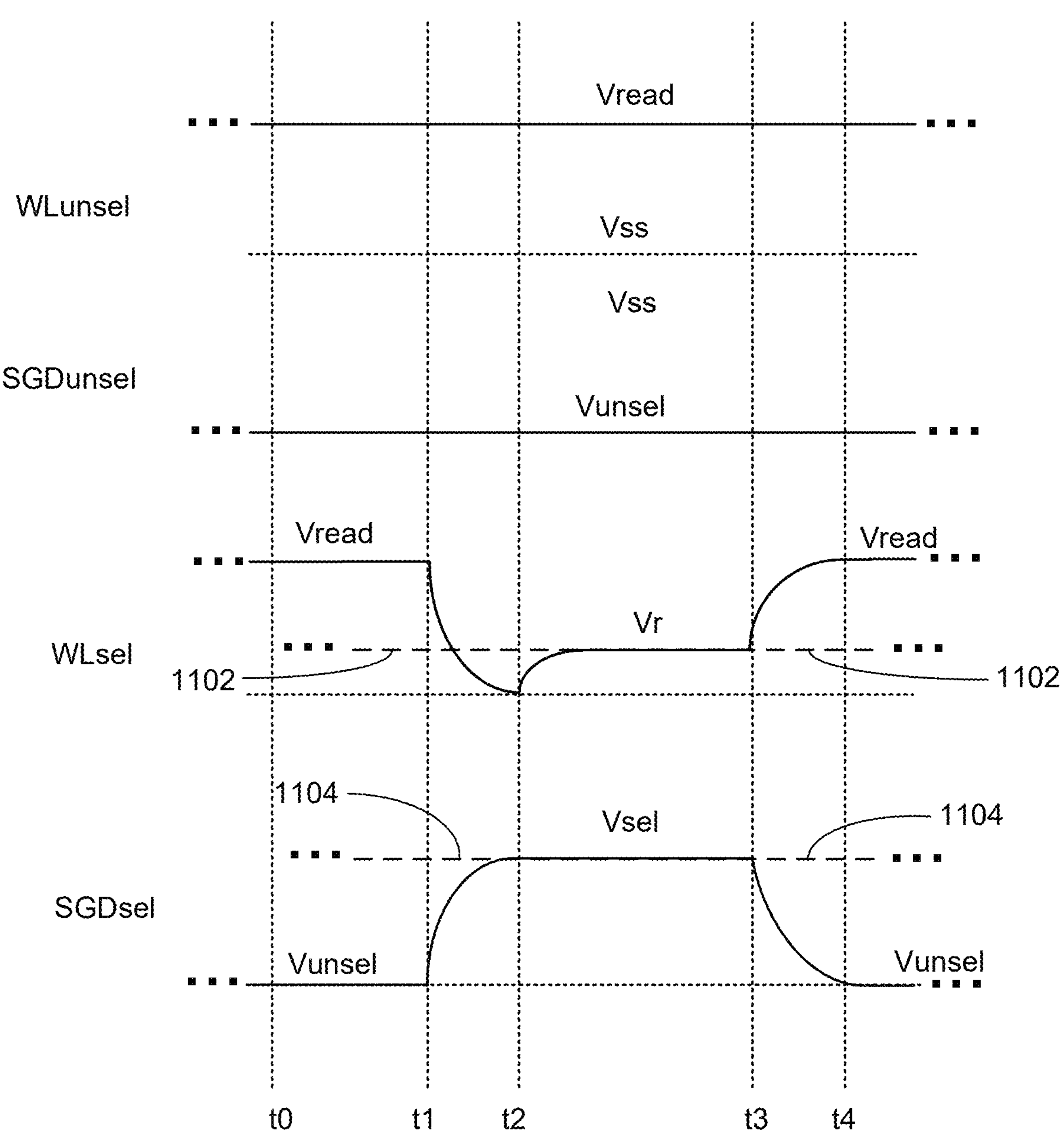
FIG. 11 is a timing diagram that describes the behavior of signals during a read process.

FIG. 11 is a timing diagram that describes the behavior of signals during one embodiment of a sequential read process without discharging the word lines and/or adjusting select lines between read operations of the sequential read process. FIG. 11 shows four signals: WLunsel, SGDunsel, WLsel and SGD sel. The signal WLunsel is the voltage applied to all unselected word lines (e.g., word lines that are not connected to memory cells selected to be read in the current read operation). The signal WLsel is the voltage applied to word lines (e.g., WL0-WL161) that are connected to memory cells selected to be read in the current read operation. The signal SGDunsel is the voltage applied to select lines (e.g., SGD0-*s*0, SGD0-*s*1, SGD0-*s*2, SGD0-*s*3, SGD0-*s*4, SGD1-*s*0, SGD1-*s*1, SGD1-*s*2, SGD1-*s*3 and SGD1-*s*4) connected to a region (e.g., 430-470), or other selectable grouping, that does not contain any memory cells selected to be read in the current read operation. The signal SGDsel is the voltage applied to select lines (e.g., SGD0-*s*0, SGD0-*s*1, SGD0-*s*2, SGD0-*s*3, SGD0-*s*4, SGD1-*s*0, SGD1-*s*1, SGD1-*s*2, SGD1-*s*3 and SGD1-*s*4) that are connected to a region (e.g., 430-470), or other selectable grouping, that contains memory cells selected to be read in the current read operation.

FIG. 11 shows the WLunsel at Vread for the entire sequential read process. That is, all of the unselected word lines will be set at Vread, and not lowered to a resting voltage (e.g., 0v) between read operations for as long as the respective word line remains an unselected word line. In prior systems, Vread is set to 6-8 volts; however, to save power for a system implementing SLC, Vread can be set at Vcc or Vdd, where Vcc is the power supply voltage (e.g., ~2.5-3.5v) and Vdd (~2.5-3.5v) is a regulated version of Vcc (thus, Vdd is a regulated supply voltage). SGDunsel is set at Vunsel for the entire sequential read process. That is, all of the unselected select lines will be set at Vunsel, and not changed between read operations, for as long as the respective select line remains an unselected word line. Vunsel is the unselected voltage (e.g., 0v) that is used for select lines connected to regions that are not selected for reading.

When a word line that has been an unselected word line is then selected for reading (because it is connected to the memory cells about to be read), its voltage (WLsel) is lowered from Vread to 0v and then raised to the read reference voltage (e.g., Vr) for sensing the data. After the sensing completes, the voltage is raised to Vread if the word line will not be a selected word line for the next read operation. If the word line will be the selected word line for the next read operation, then the voltage remains at the read reference voltage (e.g., Vr), as depicted by line 1102. Thus, word lines that are unselected are maintained at the overdrive voltage Vread until they become a selected word line, at which time they are toggled to the read reference voltage (e.g., Vr) for one or more read operations and then changed back to the overdrive voltage Vread.

When a select line that has been an unselected select line becomes a selected select line SGDsel, then its voltage is raised from the unselected voltage Vunselect to the selected voltage Vsel. In one embodiment, Vsel is set at ~3.5-6v (one or more selected voltages). After the read operation completes, the voltage on the select line is lowered back to the unselected voltage Vunselect if the select line will not be a selected select line for the next read operation. In one embodiment, Vunsel is set at 0 volts or a voltage near 0 volts (one or more unselected voltages). If the select line will be the selected select line for the next read operation, then the voltage remains at the select voltage Vsel, as depicted by line 1104. Thus, select lines that are unselected are maintained at the unselect voltage until they become a selected select line, at which time they are toggled to the select voltage (Vsel) for one or more read operations and then changed back to the unselected voltage (Vunsel).

In one embodiment, a read operation concurrently reads a page of data per bank (or per block or per plane or per memory die). In one embodiment, a page of data comprises reading form all memory cells connected to a same selected word line and in a same region of a block. Looking at WLsel and line 1102 of FIG. 11, if a previous page of data read is from memory cells connected to the same word line as the current read operation, then the selected word line remains at the read reference voltage (e.g., Vr) and if a next page of data read will be from memory cells connected to the same word line as the current read operation, then the selected word line remains at the read reference voltage (e.g., Vr). That is, the system continuously maintains the selected word line at the read reference voltage Vr while reading non-volatile memory cells connected to the selected word line that are positioned in a first region and reading non-volatile memory cells connected to the selected word line that are positioned in a second (different) region.

Looking at SGDsel and line 1104 of FIG. 11, if a previous page of data read is from memory cells in the same region as the current read operation, then the selected select line remains at the select voltage Vsel and if a next page of data read will be from memory cells in the same region as the current read operation, then the selected select line remains at the select voltage Vsel. That is, the system continuously maintains the selected select line at the select voltage Vsel while reading non-volatile memory cells connected to a first word line that are positioned in a first region and reading non-volatile memory cells connected to a second (different) word line that are positioned in the first region.

Figure 12:
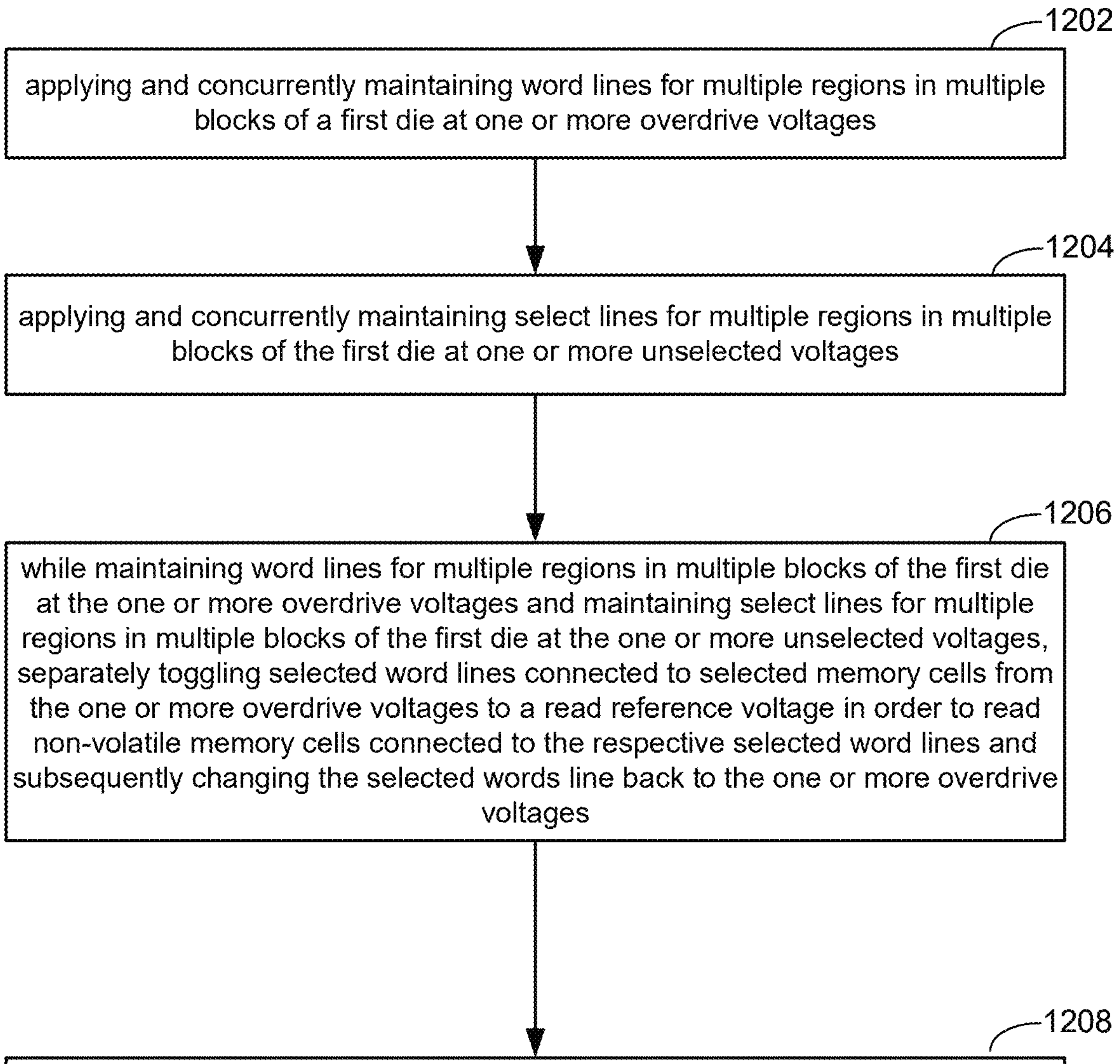
FIG. 12 is a flow chart describing one embodiment of a method performed during a read process.

FIG. 12 is a flow chart describing one embodiment of a process performed during a sequential read process without discharging the word lines and/or adjusting select lines between read operations of the sequential read process. That is, the process of FIG. 12 is an example implementation of the technology of FIG. 11. The process of FIG. 12 can be performed with the structure of FIGS. 7-9. In one embodiment, the process of FIG. 12 is performed during (as part of) the process of FIG. 10 (e.g., performing the process of FIG. 10 many times).

The process of FIG. 12 can be performed by any one of the one or more control circuits discussed above. In one embodiment, the process of FIG. 12 is performed by memory controller 120 in combination with System Control Logic 260, Column Control Circuitry 210 and Row Control Circuitry 220. Alternatively, the process of FIG. 12 can be performed entirely by a control circuit on memory die 200 (see FIG. 2A) or entirely by a control circuit on integrated memory assembly 207 (see FIG. 2B), rather than by memory controller 120. In one example, the process of FIG. 12 is performed by or at the direction of state machine 262, using other components of System Control Logic 260, Column Control Circuitry 210 and Row Control Circuitry 220.

Step 1202 includes applying and concurrently maintaining word lines for multiple regions in multiple blocks of a first die at one or more overdrive voltages. For example, FIG. 11 shows WLunsel maintained at Vread. In one embodiment, the applying and concurrently maintaining word lines at one or more overdrive voltages is concurrently and continuously performed for word lines connected to all blocks, in all planes and on multiple die connected to a common controller. In one embodiment, the applying and concurrently maintaining word lines at one or more overdrive voltages comprises continuously maintaining the word lines for multiple regions in multiple blocks of multiple planes of multiple dies at the one or more overdrive voltages without changing the unselected word lines to a resting voltage for word lines between read operations or otherwise during the read process.

Step 1204 includes applying and concurrently maintaining select lines for multiple regions in multiple blocks of the first die at one or more unselected voltages. For example, FIG. 11 shows SGDunsel maintained at Vunsel. In one embodiment, unselected select lines are kept at Vunsel without changing/adjusting the voltage between read operations or otherwise during the read process.

Step 1206 includes, while maintaining word lines for multiple regions in multiple blocks of the first die at the one or more overdrive voltages (see WLunsel of FIG. 11) and maintaining select lines for multiple regions in multiple blocks of the first die at the one or more unselected voltages (see SGDunsel of FIG. 11), separately toggling selected word lines (e.g., WLsel of FIG. 11) connected to selected memory cells from the one or more overdrive voltages to a read reference voltage in order to read non-volatile memory cells connected to the respective selected word lines and subsequently changing the selected words line back to the one or more overdrive voltages.

Step 1208 includes, while maintaining word lines for multiple regions in multiple blocks of the first die at the one or more overdrive voltages (see WLunsel of FIG. 11) and maintaining select lines for multiple regions in multiple blocks of the first die at the one or more unselected voltages (see SGDunsel of FIG. 11), separately toggling selected select lines (e.g., SGDsel of FIG. 11) connected to regions having selected memory cells from the one or more unselected voltages to a selected voltage in order to read the selected non-volatile memory cells and subsequently changing the selected select lines back to the one or more unselected voltages.

FIG. 13 is a flow chart describing one embodiment of a process performed during a sequential read process without discharging the word lines and/or adjusting select lines between read operations of the sequential read process. The process of FIG. 13 is an example implementation of the technology of the process of FIG. 12. The process of FIG. 13 can be performed with the structure of FIGS. 7-9. In one embodiment, the process of FIG. 13 is performed during (as part of) the process of FIG. 10 (e.g., performing the process of FIG. 10 many times). The process of FIG. 13 can be performed by any one of the one or more control circuits discussed above. In one embodiment, the process of FIG. 13 is performed by memory controller 120 in combination with System Control Logic 260, Column Control Circuitry 210 and Row Control Circuitry 220. Alternatively, the process of FIG. 13 can be performed entirely by a control circuit on memory die 200 (see FIG. 2A) or entirely by a control circuit on integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220.

Step 1302 includes maintaining the plurality of word lines at one or more overdrive voltages (see WLunsel of FIG. 11). Step 1304 includes maintaining the select lines at one or more unselected voltages (see SGDunsel of FIG. 11). Step 1306 includes changing the voltage on a first word line of the plurality of word lines to a read reference voltage for reading a first set of selected non-volatile memory cells connected to the selected word line in a first page in a first region (see WLsel of FIG. 11). Step 1308 includes changing the voltage on a first select line of the plurality of select lines to a selected voltage for reading the first set of the selected non-volatile memory cells (see SGDsel of FIG. 11). Step 1310 includes completing the reading of the first set of the selected non-volatile memory cells. Step 1312 includes changing the first select line back to the one or more unselected voltages. Step 1314 includes maintaining the first word line of the plurality of word lines at the read reference voltage for reading a second set of selected non-volatile memory cells connected to the selected word line in a first page in a second region. Step 1316 includes changing the voltage on a second select line of the plurality of select lines to the selected voltage for reading the first set of the selected non-volatile memory cells. Step 1318 includes completing the reading of the second set of the selected non-volatile memory cells. Step 1320 includes changing the first select line back to the one or more unselected voltages. Step 1322 includes changing the first word line back to the one or more overdrive voltages. In one embodiment, steps 1306-1322 are performed while maintaining at least a majority of the plurality of word lines at the one or more overdrive voltages and at least a majority of the plurality of select lines at the one or more unselected voltages (e.g., steps 1302 and 1304).

Figures 14, 15:
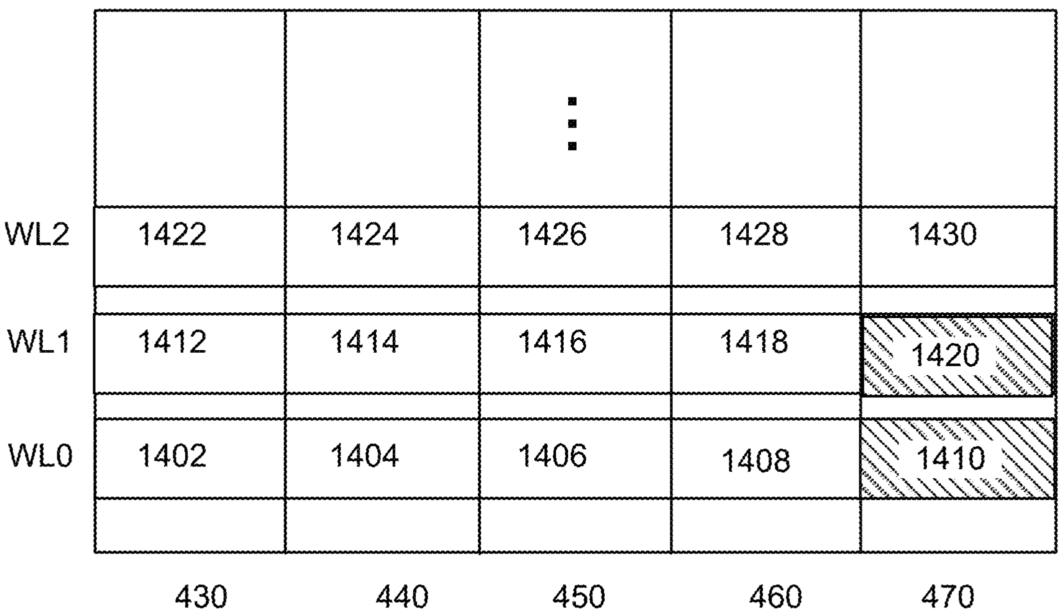
FIG. 14 is a block diagram depicting a block of memory cells.
FIG. 15 is a block diagram depicting a block of memory cells.

FIGS. 14 and 15 are block diagrams depicting a block of memory cells. Only three word lines (WL0, WL1, WL2) are depicted but it is contemplated that the blocks include more than three word lines. For each word line, the memory cells are divided into five groups, one for each of regions 430-470. Box 1402 represents the memory cells connected to WL0 that are in region 430. Box 1404 represents the memory cells connected to WL0 that are in region 440. Box 1406 represents the memory cells connected to WL0 that are in region 450. Box 1408 represents the memory cells connected to WL0 that are in region 460. Box 1410 represents the memory cells connected to WL0 that are in region 470. Box 1412 represents the memory cells connected to WL1 that are in region 430. Box 1414 represents the memory cells connected to WL1 that are in region 440. Box 1416 represents the memory cells connected to WL1 that are in region 450. Box 1418 represents the memory cells connected to WL1 that are in region 460. Box 1420 represents the memory cells connected to WL1 that are in region 470. Box 1422 represents the memory cells connected to WL2 that are in region 430. Box 1424 represents the memory cells connected to WL2 that are in region 440. Box 1426 represents the memory cells connected to WL2 that are in region 450. Box 1428 represents the memory cells connected to WL2 that are in region 460. Box 1430 represents the memory cells connected to WL2 that are in region 470.

FIG. 14 depicts box 1408 and box 1410 being shaded to indicate that in a first read operation of a sequential read process the memory cells connected to WL0 and in region 460 (box 1408) are read and in a second read operation of the sequential read process the memory cells connected to WL0 and in region 470 (box 1410) are read. This example operation is captured in the process of FIG. 13. Since two consecutive read operations read from memory cells connected to the same word line, WL0 is kept at read reference voltage Vr for both read operations without changing WL between the read operations (see steps 1306 and 1314). Since the first and second read operations read memory cells in different regions (e.g., 460 and 470), then different select lines need to be toggled to the selected voltage Vsel (steps 1308, 1312, 1316 and 1320).

Figure 16:
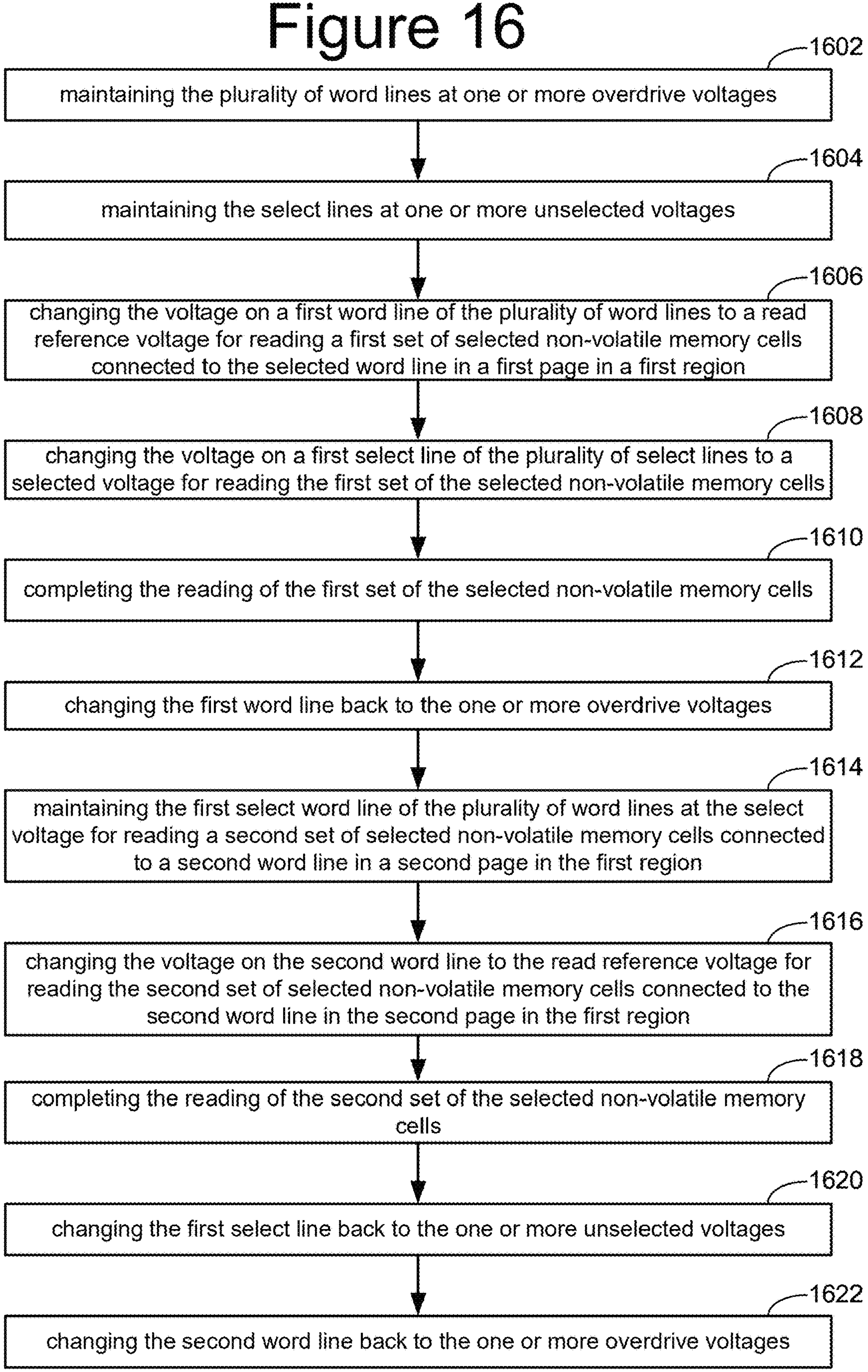
FIG. 16 is a flow chart describing one embodiment of a method performed during a read process.

FIG. 16 is a flow chart describing one embodiment of a process performed during a sequential read process without discharging the word lines and/or adjusting select lines between read operations of the sequential read process. The process of FIG. 16 is an example implementation of the technology of the process of FIG. 12. The process of FIG. 16 can be performed with the structure of FIGS. 7-9. In one embodiment, the process of FIG. 16 is performed during (as part of) the process of FIG. 10 (e.g., performing the process of FIG. 10 many times). The process of FIG. 16 can be performed by any one of the one or more control circuits discussed above. In one embodiment, the process of FIG. 16 is performed by memory controller 120 in combination with System Control Logic 260, Column Control Circuitry 210 and Row Control Circuitry 220. Alternatively, the process of FIG. 16 can be performed entirely by a control circuit on memory die 200 (see FIG. 2A) or entirely by a control circuit on integrated memory assembly 207 (see FIG. 2B), rather than by memory controller 120. In one example, the process of FIG. 16 is performed by or at the direction of state machine 262, using other components of System Control Logic 260, Column Control Circuitry 210 and Row Control Circuitry 220.

Step 1602 includes maintaining the plurality of word lines at one or more overdrive voltages (see WLunsel of FIG. 11). Step 1604 includes maintaining the select lines at one or more unselected voltages (see SGDunsel of FIG. 11). Step 1606 includes changing the voltage on a first word line of the plurality of word lines to a read reference voltage for reading a first set of selected non-volatile memory cells connected to the selected word line in a first page in a first region (see WLsel of FIG. 11). Step 1608 includes changing the voltage on a first select line of the plurality of select lines to a selected voltage for reading the first set of the selected non-volatile memory cells (see SGDsel of FIG. 11). Step 1610 includes completing the reading of the first set of the selected non-volatile memory cells. Step 1612 includes changing the first word line back to the one or more overdrive voltages. Step 1614 includes maintaining the first select word line of the plurality of word lines at the select voltage for reading a second set of selected non-volatile memory cells connected to a second word line in a second page in the first region. Step 1616 includes changing the voltage on the second word line to the read reference voltage for reading the second set of selected non-volatile memory cells connected to the second word line in the second page in the first region. Step 1618 includes completing the reading of the second set of the selected non-volatile memory cells. Step 1620 includes changing the first select line back to the one or more unselected voltages. Step 1622 includes changing the second word line back to the one or more overdrive voltages.

FIG. 15 describes the example implementation of the process of FIG. 16.

FIG. 15 depicts box 1410 and box 1420 being shaded to indicate that in a first read operation of a sequential read process the memory cells connected to WL0 and in region 470 (box 1410) are read and in a second read operation of the sequential read process the memory cells connected to WL1 and in region 470 (box 1420) are read. Since two consecutive read operations read from memory cells connected to different word lines but in the same region, SGD0 is kept at select voltage Vselect for both read operations without changing between the read operations (see steps 1608 and 1614). Since the first and second read operations read memory cells connected to different word lines (e.g., WL0 and WL1), then different word lines lines need to be toggled to the read reference voltage (steps 1606, 1612, 1616 and 1622).

A non-volatile memory has been proposed that maintains unselected word lines for multiple regions in multiple blocks of a same die at one or more overdrive voltages and multiple select lines at one more unselected voltages while performing a sequential read process for non-volatile memory cells in multiple regions in multiple blocks of the same die.

One embodiment includes a non-volatile storage apparatus, comprising: a plurality of select lines; non-volatile memory cells organized into regions, each of the regions is connected to one of the select lines; a plurality of word lines connected to the non-volatile memory cells; and a control circuit connected to the non-volatile memory cells as well as the word lines and the select lines. The control circuit is configured to perform a read process by: maintaining the plurality of word lines at one or more overdrive voltages and the plurality of select lines at one or more unselected voltages, while maintaining at least a majority of the plurality of word lines at the one or more overdrive voltages and at least a majority of the plurality of select lines at the one or more unselected voltages, toggling a selected word line of the plurality of word lines to a read reference voltage to read selected non-volatile memory cells connected to the selected word line and subsequently changing the selected word line back to the one or more overdrive voltages, and while maintaining at least a majority of the plurality of word lines at the one or more overdrive voltages and at least a majority of the plurality of select lines at the one or more unselected voltages, toggling a selected select line of the plurality of select lines to a selected voltage to read the selected non-volatile memory cells which are in a region connected to the selected select line and subsequently changing the selected select line back to the one or more unselected voltages.

In one example implementation, the non-volatile memory cells are positioned on a first die; the regions are organized into blocks with multiple regions in each block; each block is connected to a different subset of the plurality of word lines; and the control circuit is configured to maintain unselected word lines for multiple regions in multiple blocks of the first die at the one or more overdrive voltages while performing the read process for non-volatile memory cells in multiple regions in multiple blocks of the first die.

In one example implementation, the control circuit is configured to read memory c ells in multiple blocks during the read process by: while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

In one example implementation, the non-volatile memory cells are positioned on a first die; the regions are organized into blocks with multiple regions in each block; each block is connected to a different subset of the plurality of word lines; the blocks are organized into planes on the first die; and the control circuit is configured to maintain unselected word lines for multiple regions in multiple blocks in multiple planes of the first die at the one or more overdrive voltages while performing the read process for non-volatile memory cells in multiple regions in multiple blocks of the first die.

In one example implementation, the control circuit is configured to maintain unselected word lines for multiple regions in multiple blocks in multiple planes of the first die at the one or more overdrive voltages while performing the read process for non-volatile memory cells in multiple planes of the first die.

In one example implementation, the control circuit is configured to read memory cells in multiple blocks during the read process by: while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

In one example implementation, the non-volatile memory cells are positioned across multiple die; the regions are organized into blocks with multiple regions in each block; each block is connected to a different subset of the plurality of word lines; different subsets of the blocks are positioned on different die; and the control circuit is configured to maintain unselected word lines for multiple regions in multiple blocks on multiple die at the one or more overdrive voltages while performing the read process for non-volatile memory cells in multiple regions in multiple blocks of the first die.

One example implementation further comprises an interposer. The non-volatile memory cells are positioned in and across a stack of memory dies comprising multiple layers, each layer comprising multiple memory dies, the stack includes separate parallel TSVs for each memory die; the interposer is connected to the separate parallel TSVs for each memory die; and the control circuit includes a memory controller connected to the interposer and configured to perform the read process as a high bandwidth read process for data stored in the stack across multiple of the memory dies.

In one example implementation, the non-volatile memory cells are positioned on a first die; the one or more overdrive voltages include a supply voltage; the maintaining the plurality of word lines at one or more overdrive voltages comprises the control circuit maintaining at least a subset of the word lines at the supply voltage during the read process.

In one example implementation, the non-volatile memory cells are positioned on a first die; the one or more overdrive voltages include a regulated supply voltage; the maintaining the plurality of word lines at one or more overdrive voltages comprises the control circuit maintaining at least a subset of the word lines at the regulated supply voltage during the read process.

In one example implementation, the non-volatile memory cells are positioned on a first die; the regions are organized into blocks with multiple regions in each block; each block is connected to a different subset of the plurality of word lines; and the control circuit is configured to perform the read process, including: first reading non-volatile memory cells connected to the selected word line that are positioned in a first region and connected to a first select line of the plurality of select lines followed by reading non-volatile memory cells connected to the selected word line that are positioned in a second region and connected to a second select line of the plurality of select lines; maintaining the plurality of word lines, except for the selected word line, at the one or more overdrive voltages while reading non-volatile memory cells connected to the selected word line that are positioned in the first region and reading non-volatile memory cells connected to the selected word line that are positioned in the second region; maintaining the select lines at one or more unselected voltages, except for the first select line and the second select line, while reading non-volatile memory cells connected to the selected word line that are positioned in the first region and reading non-volatile memory cells connected to the selected word line that are positioned in the second region; continuously maintaining the selected word line at the read reference voltage while reading non-volatile memory cells connected to the selected word line that are positioned in the first region and reading non-volatile memory cells connected to the selected word line that are positioned in the second region; toggling the first select line from one of the one or more unselected voltages to the selected voltage when reading non-volatile memory cells connected to the selected word line that are positioned in the first region and subsequently changing the selected select line back to the one or more unselected voltages after reading non-volatile memory cells connected to the selected word line that are positioned in the first region, the second select line is maintained at the one or more unselected voltages when reading non-volatile memory cells connected to the selected word line that are positioned in the first region; and toggling the second select line from one of the one or more unselected voltages to the selected voltage when reading non-volatile memory cells connected to the selected word line that are positioned in the second region and subsequently changing the selected select line back to the one or more unselected voltages after reading non-volatile memory cells connected to the selected word line that are positioned in the second region, the first select line is maintained at the one or more unselected voltages when reading non-volatile memory cells connected to the selected word line that are positioned in the second region.

In one example implementation, the non-volatile memory cells are positioned on a first die; the regions are organized into blocks with multiple regions in each block; each block is connected to a different subset of the plurality of word lines; and the control circuit is configured to perform the read process, including: first reading non-volatile memory cells connected to the selected word line that are positioned in a first region and connected to a first select line of the plurality of select lines followed by reading non-volatile memory cells connected to a second word line that are positioned in the first region and connected to the first select line; maintaining the plurality of word lines, except for the selected word line and the second word line, at the one or more overdrive voltages while reading non-volatile memory cells connected to the selected word line that are positioned in the first region and reading non-volatile memory cells connected to the second word line that are positioned in the first region; maintaining the select lines at one or more unselected voltages, except for the selected select line, while reading non-volatile memory cells connected to the selected word line that are positioned in the first region and reading non-volatile memory cells connected to the second word line that are positioned in the first region; continuously maintaining the selected select line at the selected voltage while reading non-volatile memory cells connected to the selected word line that are positioned in the first region and reading non-volatile memory cells connected to the second word line that are positioned in the first region; toggling the selected word line from one of the one or more overdrive voltages to the read reference voltage when reading non-volatile memory cells connected to the selected word line that are positioned in the first region and subsequently changing the selected select line back to the one or more unselected voltages after reading non-volatile memory cells connected to the selected word line that are positioned in the first region, the second word line is maintained at the one or more overdrive voltages when reading non-volatile memory cells connected to the selected word line that are positioned in the first region; and toggling the second word line from one of the one or more overdrive voltages to the read reference voltage when reading non-volatile memory cells connected to the second word line that are positioned in the first region and subsequently changing the second word line back to the one or more overdrive voltages after reading non-volatile memory cells connected to the second word line that are positioned in the first region, the selected word line is maintained at the one or more overdrive voltages when reading non-volatile memory cells connected to the second word line.

In one example implementation, the control circuit is configured to maintain the plurality of word lines at the one or more overdrive voltages without changing unselected word lines to aging voltage for word lines during the read process; and the control circuit is configured to maintain the select lines at the one or more unselected voltages without changing unselected select lines to a resting voltage for select lines during the read process.

In one example implementation, the non-volatile memory cells are positioned on a first die; the regions are organized into blocks with multiple regions in each block; each block is connected to a different subset of the plurality of word lines; the non-volatile memory cells are positioned on vertical NAND strings; and each of the vertical NAND strings is positioned in one of the regions.

One embodiment includes a method for perform a read process for non-volatile memory cells organized into regions, comprising: applying and concurrently maintaining word lines for multiple regions in multiple blocks of a first die at one or more overdrive voltages; applying and concurrently maintaining select lines for multiple regions in multiple blocks of the first die at one or more unselected voltages; while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

In one example implementation, the applying and concurrently maintaining word lines at one or more overdrive voltages is concurrently and continuously performed for word lines on multiple die connected to a common controller.

In one example implementation, the applying and concurrently maintaining the word lines for the multiple regions in the multiple blocks of the first die at the one or more overdrive voltages comprises continuously maintaining the word lines for the multiple regions in the multiple blocks of the first die at the one or more overdrive voltages without changing unselected word lines to a resting voltage for word lines during the read process.

In one example implementation, the one or more overdrive voltages comprise a single overdrive voltage set at a supply voltage for the first die.

One embodiment includes a non-volatile storage apparatus, comprising: a plurality of select lines; non-volatile memory cells organized into regions, each region is connected to one of the select lines; a plurality of word lines connected to the non-volatile memory cells; and means for maintaining unselected word lines for multiple regions in multiple blocks of a same die at one or more overdrive voltages while performing a sequential read process for non-volatile memory cells in multiple regions in multiple blocks of the same die.

One example implementation further includes means for maintaining unselected select lines for multiple regions in multiple blocks of a same die at one or more unselected voltages while performing a sequential read process for non-volatile memory cells in multiple regions in multiple blocks of the same die. The means for maintaining unselected word lines and the means for maintaining unselected select lines are configured to perform the read process by: applying and concurrently maintaining word lines for multiple regions in multiple blocks of a first die at one or more overdrive voltages; applying and concurrently maintaining select lines for multiple regions in multiple blocks of the first die at one or more unselected voltages; while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

For purposes of this document, the means for maintaining unselected word lines and the means for maintaining unselected select lines can be implemented by any of the embodiments of a control circuit described above (see e.g., FIGS. 1, 2A and 2B), including a microprocessor or microcontroller, performing the processes of FIGS. 10, 12, 13 and/or 16.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
- a plurality of select lines;
- non-volatile memory cells organized into regions, each of the regions is connected to one of the select lines;
- a plurality of word lines connected to the non-volatile memory cells; and
- a control circuit connected to the non-volatile memory cells as well as the word lines and the select lines, the control circuit is configured to perform a read process by:
  - maintaining the plurality of word lines at one or more overdrive voltages and the plurality of select lines at one or more unselected voltages,
  - while maintaining at least a majority of the plurality of word lines at the one or more overdrive voltages and at least a majority of the plurality of select lines at the one or more unselected voltages, toggling a selected word line of the plurality of word lines to a read reference voltage to read selected non-volatile memory cells connected to the selected word line and subsequently changing the selected word line back to the one or more overdrive voltages, and
  - while maintaining at least a majority of the plurality of word lines at the one or more overdrive voltages and at least a majority of the plurality of select lines at the one or more unselected voltages, toggling a selected select line of the plurality of select lines to a selected voltage to read the selected non-volatile memory cells which are in a region connected to the selected select line and subsequently changing the selected select line back to the one or more unselected voltages.

2. The non-volatile storage apparatus of claim 1, wherein:
- the non-volatile memory cells are positioned on a first die;
- the regions are organized into blocks with multiple regions in each block;
- each block is connected to a different subset of the plurality of word lines; and
- the control circuit is configured to maintain unselected word lines for multiple regions in multiple blocks of the first die at the one or more overdrive voltages while performing the read process for non-volatile memory cells in multiple regions in multiple blocks of the first die.

3. The non-volatile storage apparatus of claim 2, wherein:
- the control circuit is configured to read memory cells in multiple blocks during the read process by:
  - while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and
  - while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

4. The non-volatile storage apparatus of claim 1, wherein:
- the non-volatile memory cells are positioned on a first die;
- the regions are organized into blocks with multiple regions in each block;
- each block is connected to a different subset of the plurality of word lines;
- the blocks are organized into planes on the first die; and
- the control circuit is configured to maintain unselected word lines for multiple regions in multiple blocks in multiple planes of the first die at the one or more overdrive voltages while performing the read process for non-volatile memory cells in multiple regions in multiple blocks of the first die.

5. The non-volatile storage apparatus of claim 4, wherein:
- the control circuit is configured to maintain unselected word lines for multiple regions in multiple blocks in multiple planes of the first die at the one or more overdrive voltages while performing the read process for non-volatile memory cells in multiple planes of the first die.

6. The non-volatile storage apparatus of claim 4, wherein: the control circuit is configured to read memory cells in multiple blocks during the read process by:

while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

7. The non-volatile storage apparatus of claim 1, wherein: the non-volatile memory cells are positioned across multiple die;

the regions are organized into blocks with multiple regions in each block;

each block is connected to a different subset of the plurality of word lines;

different subsets of the blocks are positioned on different die; and the control circuit is configured to maintain unselected word lines for multiple regions in multiple blocks on multiple die at the one or more overdrive voltages while performing the read process for non-volatile memory cells in multiple regions in multiple blocks of the first die.

8. The non-volatile storage apparatus of claim 1, further comprising:

an interposer;

the non-volatile memory cells are positioned in and across a stack of memory dies comprising multiple layers, each layer comprising multiple memory dies, the stack includes separate parallel TSVs for each memory die;

the interposer is connected to the separate parallel TSVs for each memory die; and the control circuit includes a memory controller connected to the interposer and configured to perform the read process as a high bandwidth read process for data stored in the stack across multiple of the memory dies.

9. The non-volatile storage apparatus of claim 1, wherein: the non-volatile memory cells are positioned on a first die;

the one or more overdrive voltages include a supply voltage;

the maintaining the plurality of word lines at one or more overdrive voltages comprises the control circuit maintaining at least a subset of the word lines at the supply voltage during the read process.

10. The non-volatile storage apparatus of claim 1, wherein:

the non-volatile memory cells are positioned on a first die;

the one or more overdrive voltages include a regulated supply voltage;

the maintaining the plurality of word lines at one or more overdrive voltages comprises the control circuit maintaining at least a subset of the word lines at the regulated supply voltage during the read process.

11. The non-volatile storage apparatus of claim 1, wherein:

the non-volatile memory cells are positioned on a first die;

the regions are organized into blocks with multiple regions in each block;

each block is connected to a different subset of the plurality of word lines; and the control circuit is configured to perform the read process, including:

first reading non-volatile memory cells connected to the selected word line that are positioned in a first region and connected to a first select line of the plurality of select lines followed by reading non-volatile memory cells connected to the selected word line that are positioned in a second region and connected to a second select line of the plurality of select lines;

maintaining the plurality of word lines, except for the selected word line, at the one or more overdrive voltages while reading non-volatile memory cells connected to the selected word line that are positioned in the first region and reading non-volatile memory cells connected to the selected word line that are positioned in the second region;

maintaining the select lines at one or more unselected voltages, except for the first select line and the second select line, while reading non-volatile memory cells connected to the selected word line that are positioned in the first region and reading non-volatile memory cells connected to the selected word line that are positioned in the second region;

continuously maintaining the selected word line at the read reference voltage while reading non-volatile memory cells connected to the selected word line that are positioned in the first region and reading non-volatile memory cells connected to the selected word line that are positioned in the second region;

toggling the first select line from one of the one or more unselected voltages to the selected voltage when reading non-volatile memory cells connected to the selected word line that are positioned in the first region and subsequently changing the selected select line back to the one or more unselected voltages after reading non-volatile memory cells connected to the selected word line that are positioned in the first region, the second select line is maintained at the one or more unselected voltages when reading non-volatile memory cells connected to the selected word line that are positioned in the first region; and toggling the second select line from one of the one or more unselected voltages to the selected voltage when reading non-volatile memory cells connected to the selected word line that are positioned in the second region and subsequently changing the selected select line back to the one or more unselected voltages after reading non-volatile memory cells connected to the selected word line that are positioned in the second region, the first select line is maintained at the one or more unselected voltages when reading non-volatile memory cells connected to the selected word line that are positioned in the second region.

12. The non-volatile storage apparatus of claim 1, wherein:

the non-volatile memory cells are positioned on a first die;

the regions are organized into blocks with multiple regions in each block;

each block is connected to a different subset of the plurality of word lines; and the control circuit is configured to perform the read process, including:

first reading non-volatile memory cells connected to the selected word line that are positioned in a first region and connected to a first select line of the plurality of select lines followed by reading non-volatile memory cells connected to a second word line that are positioned in the first region and connected to the first select line;

maintaining the plurality of word lines, except for the selected word line and the second word line, at the one or more overdrive voltages while reading non-volatile memory cells connected to the selected word line that are positioned in the first region and reading non-volatile memory cells connected to the second word line that are positioned in the first region;

maintaining the select lines at one or more unselected voltages, except for the selected select line, while reading non-volatile memory cells connected to the selected word line that are positioned in the first region and reading non-volatile memory cells connected to the second word line that are positioned in the first region;

continuously maintaining the selected select line at the selected voltage while reading non-volatile memory cells connected to the selected word line that are positioned in the first region and reading non-volatile memory cells connected to the second word line that are positioned in the first region;

toggling the selected word line from one of the one or more overdrive voltages to the read reference voltage when reading non-volatile memory cells connected to the selected word line that are positioned in the first region and subsequently changing the selected select line back to the one or more unselected voltages after reading non-volatile memory cells connected to the selected word line that are positioned in the first region, the second word line is maintained at the one or more overdrive voltages when reading non-volatile memory cells connected to the selected word line that are positioned in the first region; and toggling the second word line from one of the one or more overdrive voltages to the read reference voltage when reading non-volatile memory cells connected to the second word line that are positioned in the first region and subsequently changing the second word line back to the one or more overdrive voltages after reading non-volatile memory cells connected to the second word line that are positioned in the first region, the selected word line is maintained at the one or more overdrive voltages when reading non-volatile memory cells connected to the second word line.

13. The non-volatile storage apparatus of claim 1, wherein:

the control circuit is configured to maintain the plurality of word lines at the one or more overdrive voltages without changing unselected word lines to a resting voltage for word lines during the read process; and the control circuit is configured to maintain the select lines at the one or more unselected voltages without changing unselected select lines to a resting voltage for select lines during the read process.

14. The non-volatile storage apparatus of claim 1, wherein:

the non-volatile memory cells are positioned on a first die;

the regions are organized into blocks with multiple regions in each block;

each block is connected to a different subset of the plurality of word lines;

the non-volatile memory cells are positioned on vertical NAND strings; and each of the vertical NAND strings is positioned in one of the regions.

15. A method for perform a read process for non-volatile memory cells organized into regions, comprising:

applying and concurrently maintaining word lines for multiple regions in multiple blocks of a first die at one or more overdrive voltages;

applying and concurrently maintaining select lines for multiple regions in multiple blocks of the first die at one or more unselected voltages;

while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

16. The method of claim 15, wherein:

the applying and concurrently maintaining word lines at one or more overdrive voltages includes concurrently and continuously performed for word lines on multiple die connected to a common controller.

17. The method of claim 15, wherein:

the applying and concurrently maintaining word lines at one or more overdrive voltages comprises continuously maintaining the word lines for multiple regions in the multiple blocks of the first die at the one or more overdrive voltages without changing unselected word lines to a resting voltage for word lines during the read process.

18. The method of claim 15, wherein:

the one or more overdrive voltages comprise a single overdrive voltage set at a supply voltage for the first die.

19. A non-volatile storage apparatus, comprising:

a plurality of select lines;

non-volatile memory cells organized into regions, each region is connected to one of the select lines;

a plurality of word lines connected to the non-volatile memory cells; and means for maintaining unselected word lines for multiple regions in multiple blocks of a same die at one or more overdrive voltages while performing a sequential read process for non-volatile memory cells in multiple regions in multiple blocks of the same die.

20. The non-volatile storage apparatus of claim 19, further comprising:

means for maintaining unselected select lines for multiple regions in multiple blocks of a same die at one or more unselected voltages while performing a sequential read process for non-volatile memory cells in multiple regions in multiple blocks of the same die, the means for maintaining unselected word lines and the means for maintaining unselected select lines are configured to perform the read process by:

applying and concurrently maintaining word lines for multiple regions in multiple blocks of a first die at one or more overdrive voltages;

applying and concurrently maintaining select lines for multiple regions in multiple blocks of the first die at one or more unselected voltages;

while maintaining word lines for multiple regions in multiple blocks of the first die at the one or more overdrive voltages and maintaining select lines for multiple regions in multiple blocks of the first die at the one or more unselected voltages, separately toggling selected word lines connected to selected memory cells from the one or more overdrive voltages to a read reference voltage in order to read non-volatile memory cells connected to the respective selected word lines and subsequently changing the selected words line back to the one or more overdrive voltages; and while maintaining word lines for multiple regions in multiple blocks of the first die at the one or more overdrive voltages and maintaining select lines for multiple regions in multiple blocks of the first die at the one or more unselected voltages, separately toggling selected select lines connected to regions having selected memory cells from the one or more unselected voltages to a selected voltage in order to read the selected non-volatile memory cells and subsequently changing the selected select lines back to the one or more unselected voltages.

* * * * *